United States Patent [19]

Bahl et al.

[11] Patent Number: 5,182,773

[45] Date of Patent: Jan. 26, 1993

[54] SPEAKER-INDEPENDENT LABEL CODING APPARATUS

[75] Inventors: Lalit R. Bahl, Amawalk; Michael A. Picheny; David Nahamoo, both of White Plains; Peter V. de Souza, Mahopac, all of N.Y.

[73] Assignee: International Business Machines Corporation, Yorktown Heights, N.Y.

[21] Appl. No.: 673,810

[22] Filed: Mar. 22, 1991

[51] Int. Cl.[5] .............................. G10L 7/00; G10L 7/08
[52] U.S. Cl. ............................................. 381/41; 381/43
[58] Field of Search ........................... 381/41, 43, 29–35

[56] References Cited

U.S. PATENT DOCUMENTS

| 4,032,711 | 6/1977 | Sambur . | |
|---|---|---|---|
| 4,403,114 | 9/1983 | Sakoe . | |
| 4,748,670 | 5/1988 | Bahl et al. | 381/43 |
| 4,773,093 | 9/1988 | Higgins et al. . | |
| 4,783,802 | 11/1988 | Takebayashi et al. . | |
| 4,802,224 | 1/1989 | Shiraki et al. . | |
| 4,805,219 | 2/1989 | Baker et al. . | |
| 4,817,156 | 3/1989 | Bahl et al. | 381/43 |
| 4,819,271 | 4/1989 | Bahl et al. . | |
| 4,827,251 | 5/1989 | Bahl et al. . | |
| 4,829,577 | 5/1989 | Kuroda et al. . | |
| 4,837,831 | 6/1989 | Gillick et al. . | |
| 4,847,906 | 7/1989 | Ackenhusen . | |
| 4,926,488 | 5/1990 | Nadas et al. | 381/41 |
| 5,023,912 | 6/1991 | Segawa | 381/43 |
| 5,046,099 | 9/1991 | Nishimura | 381/43 |

OTHER PUBLICATIONS

Bahl, L. R., et al. "Recognition Results With Several Experimental Acoustic Processors," *1979 IEEE International Conference on Acoustics, Speech and Signal Processing*, vol. ASSP-79, Apr. 1979, pp. 249–251.

Bahl, L. R., et al. "Vector Quantization Procedure For Speech Recognition Systems Using Discrete Parameter Phoneme-Based Markov Word Models," *IBM Technical Disclosure Bulletin*, vol. 32, No. 7, Dec. 1989, pp. 320–321.

Levinson, S. E., et al. "Interactive Clustering Techniques for Selecting Speaker-Independent Reference Templates for Isolated Word Recognition."
*IEEE Transactions on Acoustics, Speech, and Signal Processing*, vol. ASSP-27, No. 2, Apr. 1979, pp. 134–140.

Rabiner, L. R., et al. "Speaker-Independent Recognition of Isolated Words Using Clustering Techniques," *IEEE Transactions on Acoustics, Speech, and Signal Processing*, vol. ASSP-27, No. 4, Aug. 1979, pp. 336–349.

Wilpon, J. G., et al. "Isolated Word Recognition," *IEEE Transactions on Acoustics, Speech, and Signal Processing*, vol. ASSP-33, No. 3, Jun. 1985, pp. 587–594.

Cohen, Jordan R. "Application of an Auditory Model to Speech Recognition," *J. AcousticalSociety of America*, vol. 85, No. 6, Jun. 1989, pp. 2623–2629.

Furui, Sadaoki "Speaker-Independent Isolated Word Recognition Using Dynamic Features of Speech Spectrum," *IEEE Transactions on Acoustics, Speech, and Signal Processing*, vol. ASSP-34, No. 1, Feb. 1986, pp. 52–59.

Fukunaga, K. "Introduction to Statistical Pattern Recognition" *Academic Piers*, 1972, Chapter 9, pp. 260–265.

Makhoul, John, et al. "Vector Quantization in Speech Coding," *Proceedings of the IEEE*, vol. 73, No. 11, Nov. 1985, pp. 1551–1588.

Bahl, L. R., et al. "A Maximum Likelihood Approach to Continuous Speech Recognition," IEEE Transactions on Pattern Analysis and Machine Intelligence vol. PAMI-5, No. 2, Mar. 1983, pp. 179–190.

Primary Examiner—Dale M. Shaw
Assistant Examiner—Kee M. Tung
Attorney, Agent, or Firm—Pollock, Vande Sande & Priddy

[57] ABSTRACT

The present invention is related to speech recognition and particularly to a new type of vector quantizer and a new vector quantization technique in which the error rate of associating a sound with an incoming speech signal is drastically reduced. To achieve this end, the present invention technique groups the feature vectors in a space into different prototypes at least two of which represent a class of sound. Each of the prototypes may in turn have a number of subclasses or partitions. Each of the prototypes and their subclasses may be assigned respective identifying values. To identify an incoming speech feature vector, at least one of the feature values of the incoming feature vector is compared with the different values of the respective prototypes, or the subclasses of the prototypes. The class of sound whose group of prototypes, or at least one of the prototypes, whose combined value most closely matches the value of the feature value of the feature vector is deemed to be the class corresponding to the feature vector. The feature vector is then labeled with the identifier associated with that class.

76 Claims, 9 Drawing Sheets

$$P(x) = \frac{1}{\sqrt{2\pi}\sigma} e^{-(x-m)/\sigma^2}$$

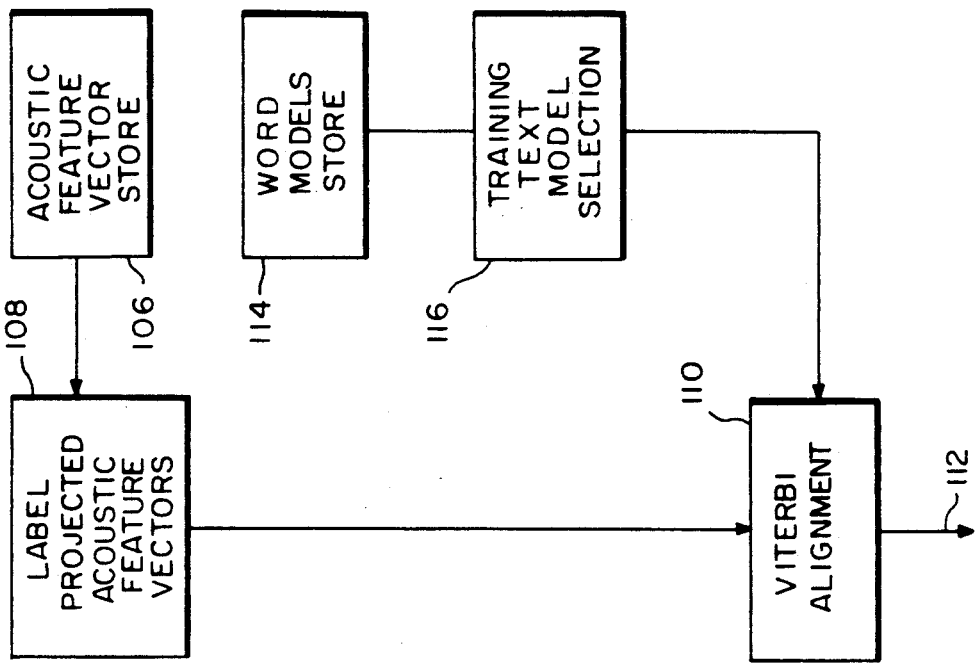
FIG. 14
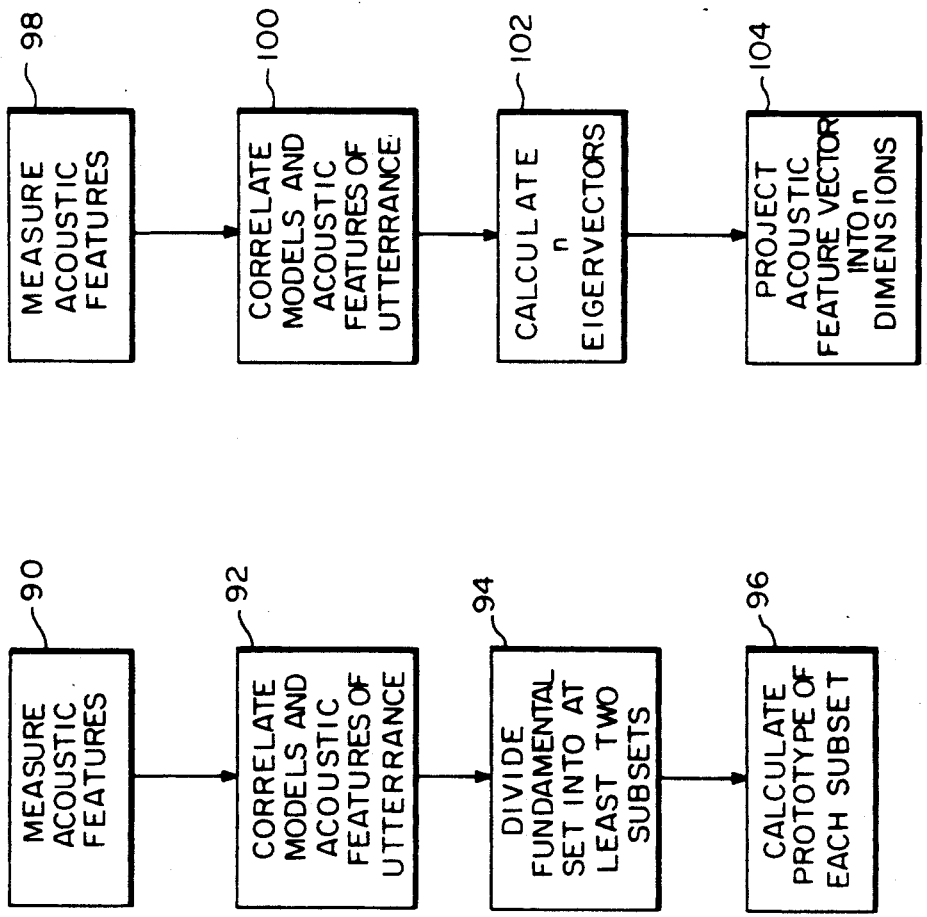
FIG. 13
FIG. 12

SPEAKER-INDEPENDENT LABEL CODING APPARATUS

FIELD OF THE INVENTION

The present invention relates to the development of an apparatus for putting into readable format the utterances from speakers, and more particularly to an apparatus and method of statistically computing the probability that a given word or a string of words will produce a particular set of speech feature vectors.

BACKGROUND OF THE INVENTION

The goal of a speech recognition apparatus is to produce the word string w with the highest a posteriori probability of occurring:

$$\hat{w} = \operatorname*{argmax}_{w} p(w|A) \qquad \text{(Eqn. 1)}$$

$$= \operatorname*{argmax}_{w} P(A|w) \cdot P(w)$$

where

P(w) is the probability of any one particular word string;

P(A) is the probability of the acoustic feature vectors;

P(w|A) is the probability of a string of words given some acoustic feature vectors; and P(A|w) is the probability of the acoustic feature vectors given the word string.

The term P(w) is generally known as the Language Model and is not relevant to the instant invention. The term P(A|w) is referred to as the Acoustic Model and relates to the computation of the probability that a given word will produce a string of acoustic features or parameters (,i.e. acoustic or speech feature vectors, or feature vectors). Putting it differently, the purpose of the Acoustic Model is to assign a probability that given a string of words, that string of words would produce a particular set of feature vectors. The present invention is directed to certain aspects of this Acoustic Model.

In brief, when one speaks, since pronunciation and emphasis on words do vary, no single string of speech feature vectors would always correspond to the spoken output from a speaker, particularly when the output from the speaker actually varies from day to day, and in fact from minute to minute. In addition, no one feature vector of an utterance will totally match a feature vector of a different utterance, even with regard to the same word.

Thus, there is a need for an Acoustic Model that will indicate the probability that a given word will produce a given set of feature vectors, for every possible word in the vocabulary. Putting it simply, there is a need for an apparatus and a method of computing the probability that a particular word in fact could produce a string of feature vectors, if that string of feature vectors were presented to the apparatus.

One of the most successful techniques for constructing Acoustic Models employs the use of Hidden Markov Models. The use of Hidden Markov Models is well known in the art of speech recognition and will not be described here. See, for example, *A Maximum Likelihood Approach to Continuous Speech Recognition*, Lalit R. Bahl et al., IEEE Transactions On Pattern Analysis and Machine Intelligence, Vol. PAMI-5, No. 2, March 1983, incorporated to this application by reference. However, do note one of interest key aspect of the use of the Hidden Markov Model technology which involves the replacement of each feature vector by a label drawn from a small number (typically less than 500) of possible labels. This reduces the amount of data that the Hidden Markov Model component must deal with and thus simplifies later computational and modelling stages of the recognizer.

Assigning a label to a feature vector in the prior art has been achieved by noting that groups of feature vectors in n-dimensional space divide that space into a number of convex regions. The values of the feature vectors in the regions are averaged such that each region is represented by a prototype and each feature vector extracted from speech is identified with the prototype in space to which it is the closest. The feature vector is accordingly labelled with an identifier of that prototype.

The problem with the prior art is that for each of the regions to which a prototype has been assigned, there are, in addition to the feature vectors which correspond to a particular sound, a number of additional feature vectors that are associated with other sounds. Consequently, the prior art speech recognition technique results in a large number of recognition errors. For example, sounds such as "s", "f" and "sh" are sometimes all given the same label.

Thus, some technique, and an apparatus for effecting such technique, is needed to impart some kind of speech knowledge into speech recognition in order to eliminate as much as possible the number of errors that are made with the prior art technique.

BRIEF DESCRIPTION OF THE PRESENT INVENTION

The present invention discloses a new technique, and an apparatus, to locate all the different regions in space having speech feature vectors that correspond to a certain class of sound extracted from a spoken word. In essence, a given space is divided into a number of regions each containing speech feature vectors that associate with potentially a number of different sounds. Each of these regions is represented by a prototype which has associated therewith a vector of means, a vector of variances and a a priori probability. A class of sound may be represented by at least one of the prototypes. For this invention, a prototype may also be referred to as a prototype vector, and the means and variances vectors simply means and variances.

When a feature vector which has a number of feature values is extracted from a spoken word, at least one feature value of that feature vector is compared with the different prototypes to find a closest match. This is done by computing a value for each prototype, this prototype value being a function of the input feature vector and the means, variances and the a priori probability of the prototype. Each of the classes of sound is represented by at least two of the prototypes and has an identifier associated with it. And when a closest match is found between a particular prototype (or a number of the prototypes) and the feature vector, the identifier associated with the class represented by that particular prototype is used to label the feature vector.

In a more specific embodiment, the respective values of the different prototypes associated with a particular class of sound are combined, as for example summed, and compared with each other.

It is therefore an objective of the present invention to provide a technique, and an apparatus for performing such technique, that would enhance the operation of a speech recognition system by eliminating, by possibly a factor of two to three, the error rate of the prior art technique.

BRIEF DESCRIPTION OF THE FIGURES

The above-mentioned objective and advantages of the present invention will become more apparent and the invention itself will be best understood by reference to the following description of the invention taken in conjunction with the accompanying drawings, wherein:

FIG. 12 is a simplified flow chart illustrating the centroid computation step of the present invention technique;

FIG. 13 is a simplified flow chart illustrating the additional preprocessing step of the present invention technique; and FIG. 14 is a simplified flow chart illustrating the speech-sound-feature-vector correspondence step of the present invention technique.

DETAILED DESCRIPTION OF THE PRESENT INVENTION

Figure 1:
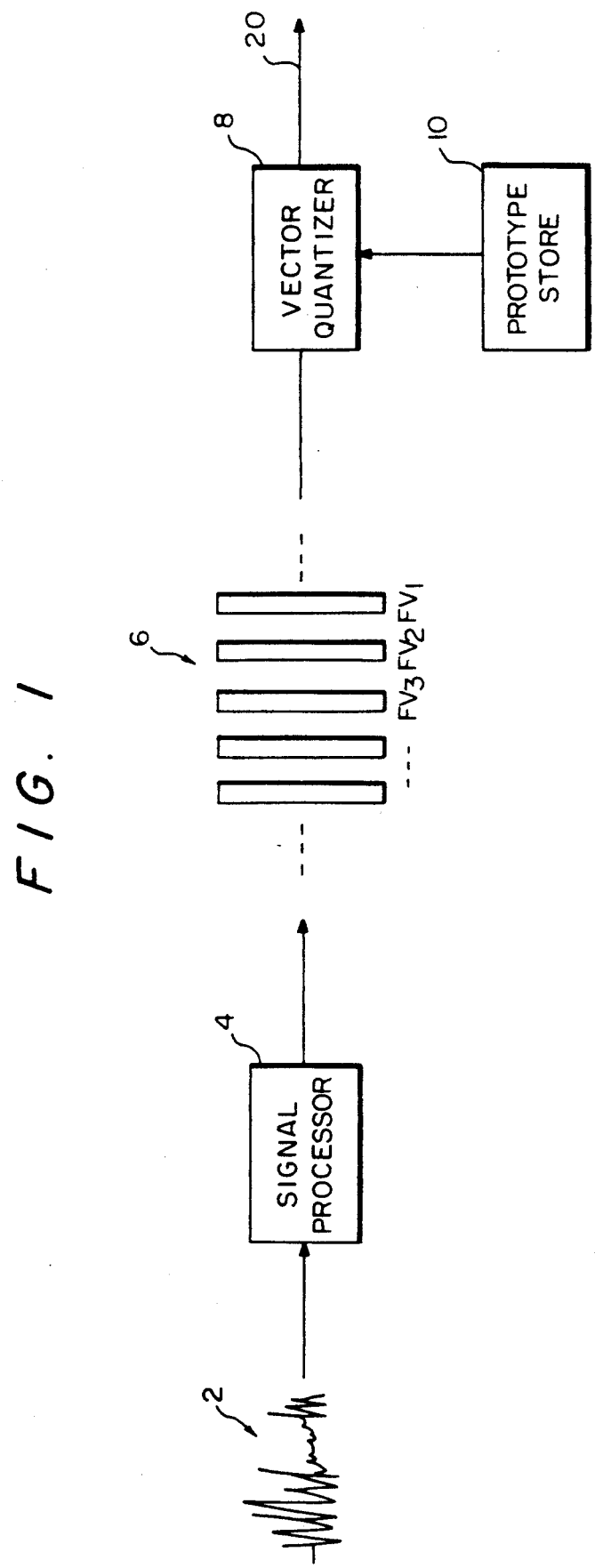
FIG. 1 is a simplified sketch of a system for labeling feature vectors extracted from speech.

With reference to FIG. 1 (which is being used to describe both the prior art and the present invention), a speech signal 2, from a given string of words, is fed to a signal processor 4. Signal processor 4 can include electronic components such as an analog-to-digital converter and a spectral analyzer. The purpose of signal processor 4 is to extract from speech signal 2 a series of parameter vectors or speech acoustic feature vectors. For the example system discussed with reference to FIG. 1, it is assumed that 100 feature vectors are being processed by signal processor 4 per second. Thus, if a person were to utter for 10 seconds, 1,000 feature vectors, such as those designated by 6, are produced. The acoustic model of the present invention further has as components a vector quantizer 8 and a prototype store 10.

Speech signal 2 may be representative of a portion of a string of words such as, for example, "The Cat In The Hat". When input to signal processor 4, for example the signal processor described in *Application Of An Auditory Model To Speech Recognition,* Jordan R. Cohen, Jour. Acoust Am. 85(6), June 1989, incorporated to this application by reference, the speech signal is measured by the signal processor and spectrally analyzed. The spectral analysis, for this embodiment, comprises measuring the energy of the speech signal as a function of time in a number of different frequency bands, as for example 20. The number of frequency bands is chosen to reflect a balance between a minimal and a maximum number of frequencies required to prevent degradation of the signal.

The energy in each of the 20 frequency bands, from approximately 200 Hz to 7 KHz for example, is measured 100 times each second. Consequently, the output from signal processor 4 is a series of 20-dimensional feature vectors designated 6. Each of the feature vectors has a number of components each representing the energy of the signal at one of the frequencies, for example at 200 Hz, 300 Hz, 400 Hz, etc. The 20-dimensional feature vectors may be referred to as $FV_1$, $FV_2$, $FV_3$ etc.

In a speech recognition system, the feature vectors extracted from the utterance of a speaker are labeled as different classes of sound in a process referred to as vector quantization, described hereinbelow.

Figure 2:
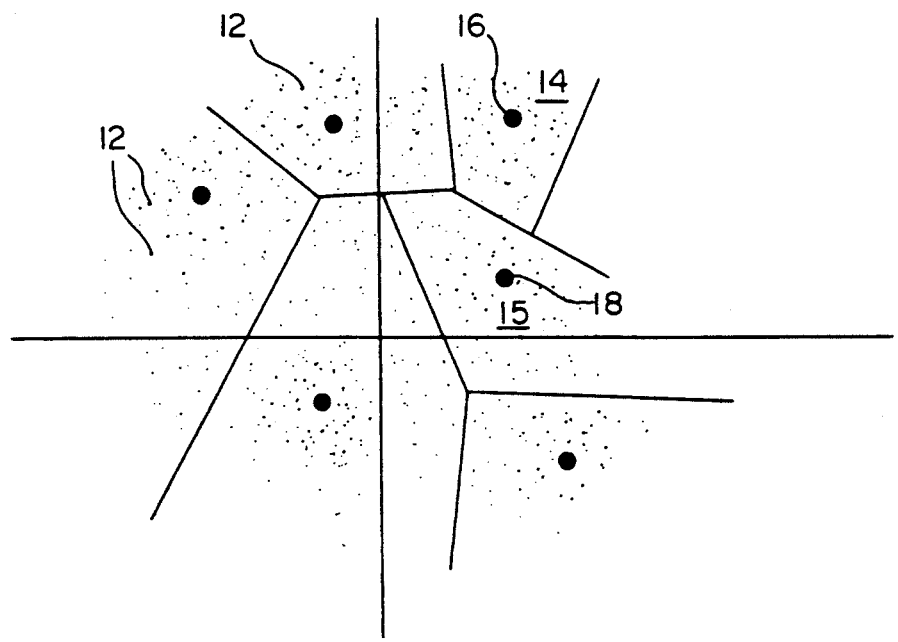
FIG. 2 is a two dimensional representation of a number of feature vectors in space and the division of the feature vectors into a number of convex regions.

For ease of explanation, instead of demonstrating with a 20-dimensional space, reference is now directed to the 2-dimensional space illustrated in FIG. 2 where a number of 2-dimensional speech feature vectors are represented by dots, designated as 12. In a prior art vector quantization technique such as that disclosed in *Vector Quantization In Speech Coding,* John Makhoul et al., Proceedings of IEEE, Vol. 73, No. 11, November 1985, the different speech feature vectors are separated into different clumps in space and divided into regions known as convex regions. For example, the 2-dimensional space is divided up into neighboring convex regions such as, for example, regions 14 and 15. Without going into much detail, this clumping of the different feature vectors into regions is referred to as clustering. In essence, what clustering does is to calculate a mean value for each of the convex regions by computing the respective mean values of the feature vectors in each of the regions. The resulting mean value in each of the regions, shown as a heavy dot, is referred to as a prototype or a prototype vector. For example, prototype vectors 16 and 18 are shown in regions 14 and 15, respectively. An identifier, for example a given number, is assigned to each of the prototype vectors. Each of the prototype vectors may also be referred to as a class of sound.

In the prior art technique, to determine what class sound a feature vector is associated with, the Euclidean distance separating the feature vector and the prototype vector is found using the following equation:

$$\text{Euclidean Distance} = \sum_i (X_i - P_i)^2 \qquad \text{(Eqn. 2)}$$

where
X is the feature vector;
P is the prototype vector; and
i represents the components of the feature vector or the prototype vector.

By using the Euclidean distance equation, the closest prototype vector to the of interest feature vector is found; and the identifier of that prototype vector is used to label that feature vector. This is the process referred to before as "vector quantization" or "labeling each feature vector".

And this vector quantization is performed by a vector quantizer, such as 8 shown in FIG. 1. (Assume for the moment that vector quantizer 8 is a conventional vector quantizer.) Thus, there is produced at output 20 of vector quantizer 8 a string of labels, as for example 100 labels per second if the system is processing 100 feature vectors per second. Each of the output labels takes on the value corresponding to the prototype vector to which it is identified with.

The problem with the prior art technique is that albeit the space containing the different classes of sound has been divided into a number of regions, in actuality each of the regions has nothing whatsoever to do with speech per se. In other words, although each region identified with a particular class of sound has a majority of the feature vectors within the region related to that class, the region nonetheless has a lot of other feature vectors that do not. Consequently, feature vectors representing similar sounds are often given the same label, thereby producing a possibly unacceptable error rate during speech recognition.

Figure 3A:
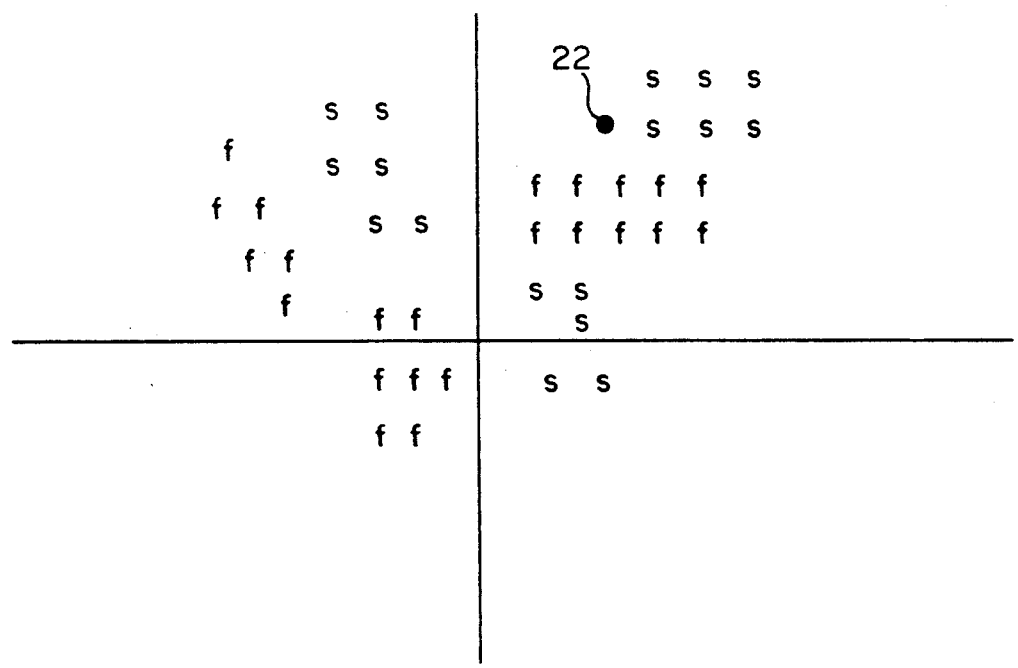
FIG. 3A is a two dimensional representation of two different speech sounds to be used for illustration of the basic concept of the present invention.
Figure 3B:
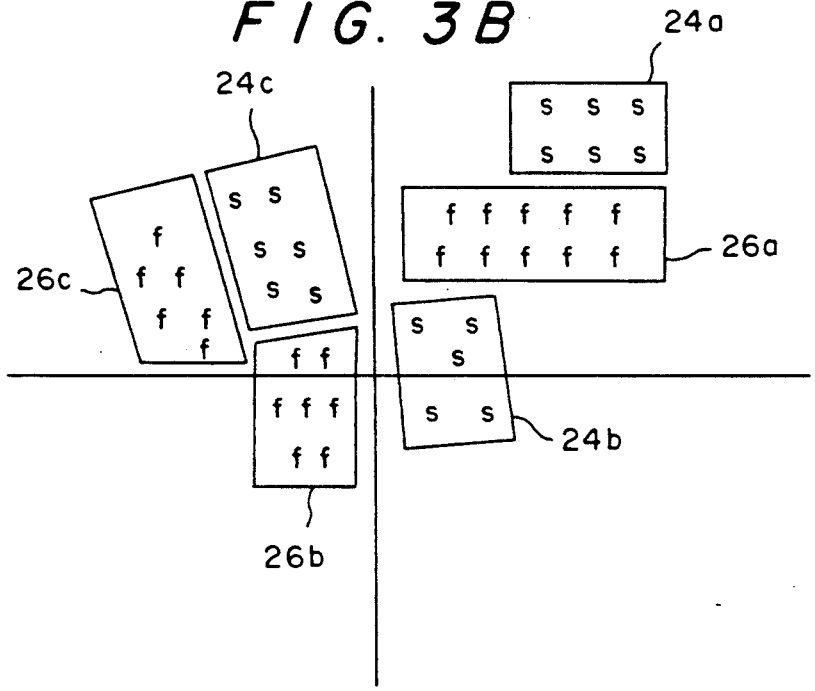
FIG. 3B is a two dimensional representation of the FIG. 3A drawing but with different groups of the same speech sound class being separated into distinct convex regions for illustrating the basic concept of the present invention.

The basic concept of the present invention may be gleaned with reference to the 2-dimensional illustrations of FIGS. 3A and 3B. Assume for this discussion that instead of the 30 or 40 sounds an individual usually utters, there are now only 2 sounds "s" and "f". In the FIG. 3A space, the sounds s and f are shown to be scattered throughout.

Given a space populated with the s and f sounds such as those shown in FIG. 3A, if a feature vector were to be located as shown by dot 22, the assumed conventional vector quantizer for the FIG. 1 system would have a difficult time determining whether that feature vector is associated with the s or f sound. Consequently, the label output from the conventional vector quantizer to identify that feature vector may well be wrong. Accordingly, some information which may be useful could be lost.

With reference to FIG. 3B, to design the vector quantizer 8 shown in FIG. 1 according to the present invention, all of the feature vectors in the space associated with the s sound and all feature vectors associated with the f sound are located and grouped into respective regions 24a to 24c and 26a to 26c. For the FIG. 3B example, there are therefore shown 3 regions for the class of sound s and 3 regions for the class of sound f. In other words, there are 3 prototypes representing the f class sound and 3 prototypes representing the s class sound in the FIG. 3B example. Each of the prototypes has a number of associated feature vectors, an identifier and a prototype value, obtained by appropriate computational procedures to be described later.

To determine which class of sound an input feature vector is associated with, at least one of the feature values of that feature vector is compared with the prototype values of all of the possible prototypes. If the prototype whose prototype value to which the feature value of the feature vector is most closely associated with is s, the vector quantizer would label the feature vector with the identifier of the class s. Conversely, if the prototype value of the prototype closest to the feature vector value is an f, the feature vector is identified with the class f. Thus, the basic premise behind the present invention is to represent each speech sound with a set of two or more prototypes, with each prototype being associated with a convex region in space. And it is the combination, or mixture, of the plurality of prototypes in space relating to a class of sound which imparts to the technique of the present invention certain speech knowledge that allows the present invention technique to decrease, by possibly a factor of two to three, the error rate of prior art speech recognition techniques.

To implement the inventive concept of the present invention outlined above, described below is an embodiment technique which requires the following procedural steps:

1. Additional preprocessing of the feature vectors;
2. Effecting correspondence between the speech sound and the feature vectors, i.e. a speech-sound-feature-vector correspondence; and
3. Computing the number of prototypes and where these prototypes are relatively located in space.

To refine the technique of the present invention, steps 2 and 3 have to be repeated.

Before additional preprocessing of the feature vectors can take place, a set of training feature vectors, which correspond to training utterances, has to be obtained and stored, for example in the acoustic feature vector store 64 shown in FIG. 11, which will be described in more detail later. And each training feature vector is identified as corresponding to a speech sound in the training utterances.

In speech recognition, each word is ordinarily represented as a string of speech sounds. For example, the word "cat" is represented by the model "k ae t". Since English spelling is irregular, the mere fact that a person knows the pronunciation of the word and how the word is spelled does not necessarily allow him to immediately figure out what speech sounds are represented by the word. For the present invention, each word is mapped onto a string of speech sounds or phonemes (or a network of elemental models). Thus, each word is made up of phonemes or phones. It has been known that it takes an inventory of approximately 80 phones to enable a vector quantizer to generate the different sounds that make up the English language. Of course, for a different language, an inventory having a different number of sounds is needed.

Figure 4:
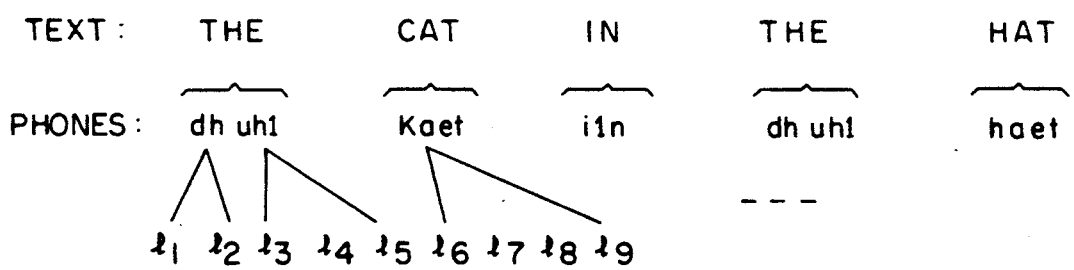
FIG. 4 is a simple diagram showing the correlation between a string of text and different sounds.

To correlate the different phones to feature vectors generated by the utterance of a word, the well known "Viterbi Alignment" technique is used for the being illustrated embodiment of the present invention. For a more detailed discussion of the Viterbi Alignment technique, see above-referenced Bahl et al. article. In essence, the Viterbi alignment technique, using Hidden Markov Model technology, aligns or correlates each phone in a given text to find what label (i.e. the output from the vector quantizer) each phone corresponds to. For illustration, the text string "The Cat In The Hat" and the phones representing the sounds of the string are shown in FIG. 4. Further, each phone has been identified with corresponding labels, as for example the phone "dh" for the word "the" corresponds to labels $1_1$ and $1_2$; while the phone "uhl" corresponds to labels $1_3$, $1_4$ and $1_5$. Once the correspondence between the labels and each phone is known, it follows by logic that the feature vectors corresponding to each label of the word of the string of words would also be known. Accordingly, correspondence between feature vectors and speech sounds can be established by the Viterbi alignment technique.

For the example shown in FIG. 4, to get all the attributes of a sound, for example the sound "ae" such as in "cat" and "hat", all the feature vectors representing the same phone are pooled together. Of course, to provide an inventory of approximately 80 different sounds, a speaker has to speak a sufficient number of sentences to enable adequate grouping of sufficient phones to form the inventory. A first set of training classes of sound is required before any additional preprocessing of the feature vectors.

Figure 5:
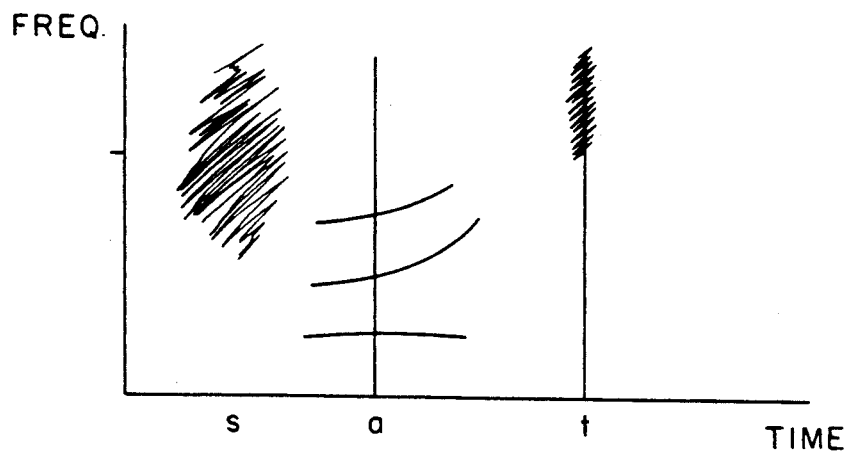
FIG. 5 is a simplified sketch of spectral frequencies for illustrating the different features of a word.

To understand the additional preprocessing step of the present invention, it should be recognized that in speech, the feature vectors representing the speech sound have to be viewed over time. For example, FIG. 5 shows the output frequency of the word "sat" being plotted against time. In essence, FIG. 5 shows a lot of energy at a particular frequency for the sound "s" in "sat". Also, the "a" sound in "sat" is represented by concentrations of energy at different frequencies. Further, there is a little gap of silence between sounds "a" and "t"; and the "t" sound in "sat" has a burst of high frequency energy at its end. It can thus be seen that the important thing in speech is not so much the value of a feature vector at any one particular point in time, but rather the entire pattern of the word over a period of time, as for example 1/10 of a second. This is due to the fact that as one speaks, the different sounds would blend into one another such that there is at least one set of frequencies associated with each sound, for example the sound "a".

Thus, depending on what sounds precede it and what sounds follow it, the pattern of energy concentrations of a sound will change—as for example "s", which depends upon whether it is followed by "oo" like "sue" or by "e" like "see". What is important in speech recognition, therefore, is not individual feature vectors in isolation but rather the pattern of how the feature vectors behaves as a function of time.

The inventors recognize the above by realizing one of the problems of prior art speech recognition techniques is that although energy is measured as a function of frequency a number of times a second, a label is produced nonetheless for each of the feature vectors. The inventors further recognize another prior art technique weakness in which each feature vector is processed without any attention being paid to the feature vectors that came before it and after it. In other words, it is difficult to look at one individual feature vector and decide from that whether it is a "a" as in "say" or a "a" as in "sat".

Figure 6:
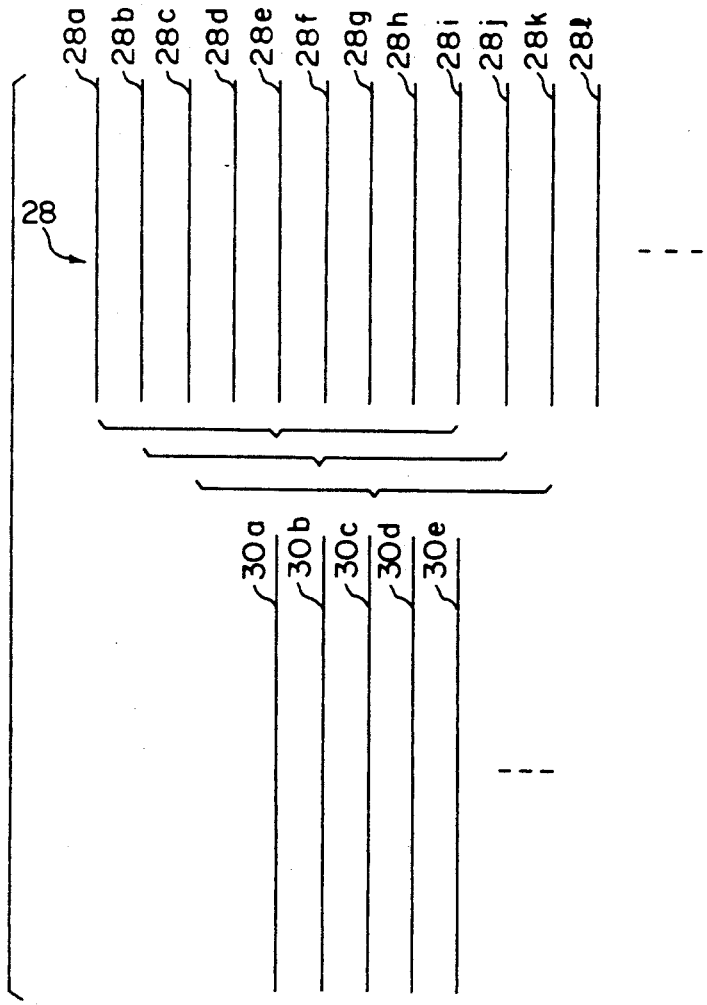
FIG. 6 is an illustration of an example splicing technique in which a plurality of feature vectors are combined into a number of correspondingly different prototype vectors.

To overcome the problems of the prior art technique, a so-called "splice and rotation" technique is used. The splicing portion of such technique is known and described in *Speaker-Independent Isolated Word Recognition Using Dynamic Features of Speech Spectrum,* Sadaoki Furui, IEEE Transactions in Acoustics, Speech and Signal Processing, Vol. ASSP-34, No. 1, February 1986, incorporated herein by reference. With reference to FIG. 6 where a number of feature vectors $28a$ to $28l$ are shown, the method of the present invention effects the splicing technique as follows. Assume each of the feature vectors is a 20-dimensional feature vector as was discussed with reference to FIG. 1. Splicing takes place when adjacent m-dimensional feature vectors are concatenated together to form a larger n-dimensional feature vector. For the example illustrated in FIG. 6, each of the 20-dimensional feature vectors has appended to it the sum of the squares of its feature values to create a 21-dimensional feature vector. Then, 9 adjacent 21-dimensional feature vectors, for example feature vectors $28a$–$28i$, are spliced together to produce a single 189-dimensional feature vector $30a$. The next set of 9 consecutive 21-dimensional feature vectors $28b$–$28j$ are spliced together to form the next 189-dimensional feature vector $30b$. Splicing continues with the concatenation of the next 9 21-dimensional feature vectors $28c$–$28k$ to form 189-dimensional feature vector $30c$, etc. Since each of the 189-dimensional feature vectors is comprised of 9 consecutive 21-dimensional feature vectors spliced together, there is plenty of information over time in each of these 189-dimensional feature vectors to provide a good representation of a specific speech sound, which individual 21-dimensional feature vectors cannot do. But 189-dimensional feature vectors are enormously large vectors, both in terms of the number of dimensions and the amount of data to be dealt with.

Since speech does not move that quickly over time, there is a lot of correlation between one feature vector and another over time, even at a processing level of 100 centiseconds. Thus, when 20 adjacent 21-dimensional feature vectors are concatenated together, a lot of redundant information is present in the resulting 189-dimensional feature vectors. More often than not, since speech does not change quickly, if a feature vector is known at a given time, the feature vector following it is not that much different from it. With the knowledge that redundant information is present in the 189-dimensional feature vectors, the inventors recognized that if the redundant information were to be removed, the 189-dimensional feature vector could be reduced to a smaller, more manageable dimensional feature vector.

Figure 7A:
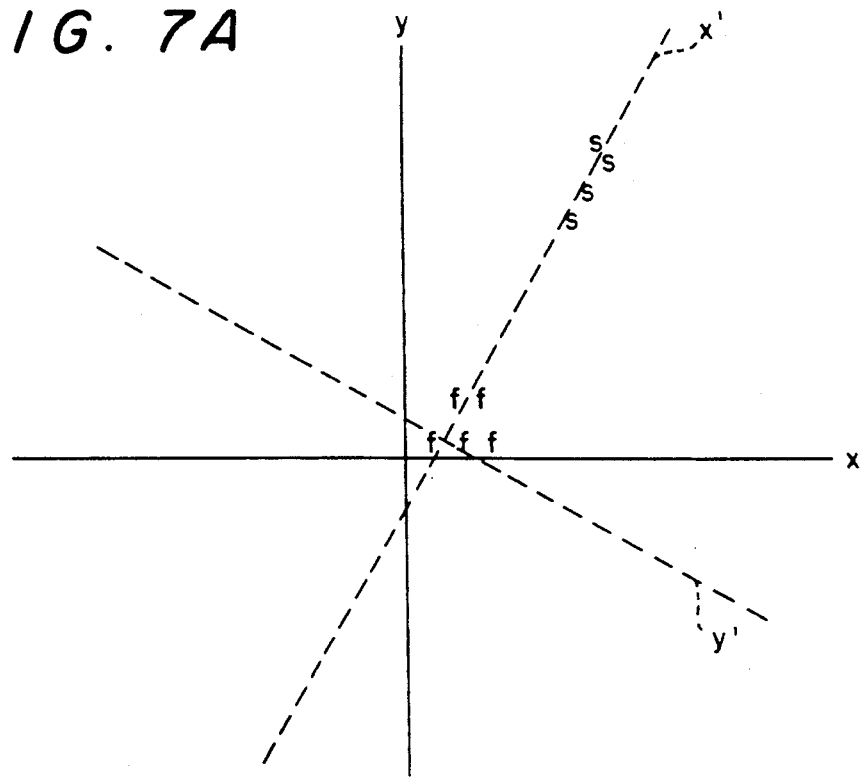
FIGS. 7A and 7B are diagrams illustrating the projection of a number of the same speech sounds in a two dimensional space using the, Generalized Eigenvectors technique.

The technique that the inventors have decided on for this embodiment is the known "Generalized Eigenvectors" technique, to be discussed with reference to FIGS. 7A and 7B. A discussion of the Generalized Eigenvectors technique is given in *Introduction To Statistical Pattern Recognition,* K. Fukunaga, Chapter 9: 258–281, Academic Press, 1972, incorporated herein by reference. For the present invention embodiment, the Generalized Eigenvectors technique works as follows. Again assume there are only two types of sounds, s and f, existing in the 2-dimensional space illustrated in FIG. 7A. To discriminate a feature vector extracted from speech between s and f, in practice only one dimension of the classes is needed if the axes are rotated as shown by the dashed lines. By rotating the X and Y axes, it can be seen that the only component that is truly relevant is the X component since both f and s are aligned along the rotated X' axis. Thus, there is very little information in the Y components of f and s. Accordingly, the 2-dimensional space may be reduced into a 1-dimensional space with only minimum amount of lost information.

Figure 7B:
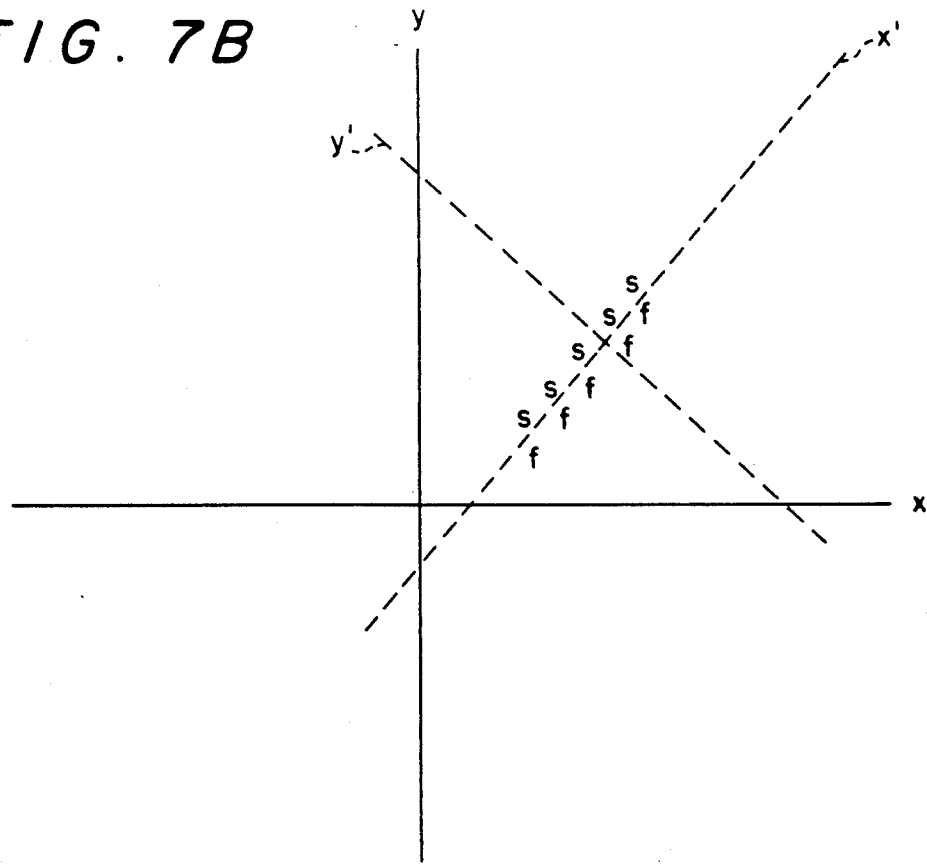

FIG. 7B illustrates another scenario whereby the Generalized Eigenvectors technique is used to eliminate one component of a 2-dimensional set of feature vectors. In this scenario, all of the feature vectors are aligned along the rotated X' axis. As shown, the important information for discriminating between the s and f sounds does not reside along the rotated X' axis, since all s feature vectors are above the rotated X' axis and all f feature vectors are below the same. Rather, it is along the rotated Y' axis that the important information for discriminating between the two sounds resides. Of course, there are variations between the individual s and f feature vectors along the X' direction. But the point here is that since both the s and f feature vectors are substantially aligned along, but respectively above and below, the rotated X' axis, if one were to look along the X' axis, one would see the s and f feature vectors only along the Y' axis. Thus, in the FIG. 7B scenario, as far as discrimination between the s and f sounds is concerned, the rotated X' direction is essentially useless since it is the Y' direction which is significant.

In essence, the Generalized Eigenvectors technique is basically a technique of projecting a vector along a particular direction (or set of directions) in order to reduce m-dimensional data to smaller n-dimensional data without losing any important discrimination information. But in order to use the Generalized Eigenvectors technique, the classes to be discriminated between have to known. And that is the reason why an initial speech-sound-feature-vector correspondence step to create a set of initial prototypes that represent the different classes of sound to discriminate between has to be taken for the present invention technique.

With the Generalized Eigenvectors technique and given the initial correlated inventory of approximately 80 sound classes, the 189-dimensional feature vectors described above can be reduced into corresponding 50-dimensional feature vectors. This is done of course by pooling all the data extracted from the predetermined number of uttered sentences and projecting the pooled data into the 50-dimensional space. For the rest of this discussion, except otherwise noted, the feature vectors are assumed to be 50-dimensional vectors.

With the many feature vectors each representing a given sound in a space, there remains a need to compute how many prototype vectors are required to represent each of the approximately 80 classes of sound. In other words, computation has to be made to find out the number of prototypes and where they are in relative relationship to each other in space (,i.e. the mean values, or means; the variance values, or variances; and the a priori probabilities associated with the prototypes). Thus, each prototype can be characterized by a centroid representing the means or arithmetic average of its associated acoustic feature vectors.

For the present invention, the method of finding a set of centroids that represent a given sound, for example s, is as follows. From empirical studies it has been found that it takes approximately 50 centroids to adequately represent a sound. To obtain the 50 centroids from the great number of feature vectors in space, a "K-Means Clustering Algorithm" is used.

Figure 8:
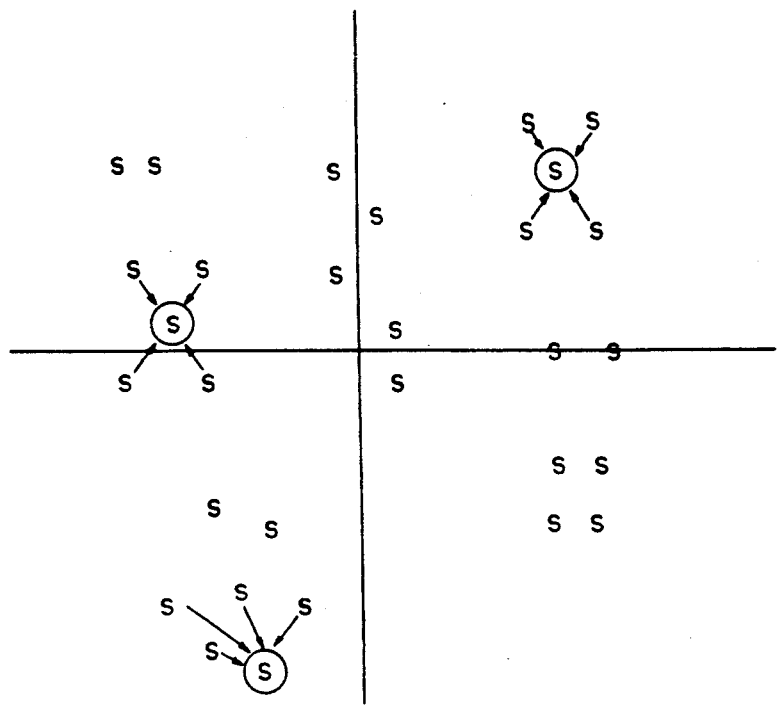
FIG. 8 is a diagram of a number of example "s" vectors in a two dimensional space.

In brief, the K-Means clustering algorithm does the following. A given number of speech feature vectors, for example 100 of the s feature vectors, are picked at random. Assume these 100 s feature vectors are 100 centroids. Each of these assumed s centroids is assigned a number. And starting with the circled centroids in FIG. 8, the respective surrounding s vectors will be drawn into association with the corresponding circled centroids due to their close distance. In other words, the feature vectors closest to a circled centroids will be grouped with that centroid. Thus, for each of the 100 assumed centroids, there is associated therewith a number of feature vectors. A new centroid may be computed by averaging the associated feature vectors together. This procedure is repeated for a number of iterations during which the average distance between the feature vectors decreases, as the centroids tend to migrate to where most of the data is. Eventually, the average distance between the feature vectors no longer changes but rather stays substantially constant, as the centroids reach convergence.

As noted above, the number of centroids necessary to give a good representation of a sound is found to be approximately 50. Thus, with still 100 centroids at convergence, a method has to be found to decrease this total number of centroids. This is done by taking the two closest centroids, computing their average, and replacing them with a new centroid having their average value. This process of merging the two closest centroids and averaging them is repeated for a number of iterations until only 50 centroids remain. This process is referred to as "Euclidean Clustering" technique. The Euclidean clustering technique is performed for each speech sound of which, as mentioned previously, there are approximately 80 for the present invention embodiment. When all is done, each of the approximately 80 speech sounds is represented by 50 centroids, which represent the mean average associated with the sound.

In order to find the respective volumes associated with the centroids and where the centroids are in relationship to their associated sounds in the defined space, a variance has to be found for each of the centroids. This is done for the present invention by a "Gaussian Clustering" technique.

In Euclidean clustering, closeness is defined by the Euclidean distance, which is defined by the following equation:

$$\sum_i (x_i - C_i)^2 \qquad \text{(Eqn. 3)}$$

Equation 3 is the same as equation 2 but for the fact that P has been replaced by C, which is the centroid where i is the ith component of the centroid.

In Gaussian clustering, a similar type of distance as in equation 3 is used. But the Gaussian clustering technique actually finds the centroid with the highest probability as illustrated by the following equation:

$$P(x) = \frac{P}{(2\pi)^{n/2}\sigma_i} e^{-\frac{1}{2}[\Sigma_i(x_i - M_i)^2/\sigma_i^2]} \qquad \text{(Eqn. 4)}$$

where P is the a priori probability; and
σ is the variance.

Equation 4 states that the probability of a particular centroid [P (x)] is defined as the probabilities computed with a Gaussian distribution where the variance of the centroid and its a priori probability are taken into account. For this discussion, the a priori probability may be equated with the estimate, without the gaussian distribution, of the relative frequencies of the classes of sound.

To make the computation easier, instead of using Equation 4 to compute the centroid, the logarithm of the probability may be used. With a logarithm, if some-thing has the lowest probability, then it would also have the lowest log of the probability. Therefore, if dealing with the log of probability and if factor $2\pi$, which is the same for every possible centroid, is neglected, then the following equation is obtained.

$$\ln P(\overline{w}) = -\Sigma \log \sigma_i - \tfrac{1}{2}\Sigma(x_i - M_i)^2/\sigma_i^2 + \log P \quad \text{(Eqn. 5)}$$

Equation 5 is similar to the Euclidean distance as defined in Equation 3. However, for Equation 5, the squares of the difference between the vector and the mean are summed. Putting it simply, Equation 5 does the same thing as Equation 3 except that each dimension is weighted by the reciprocal of the variances and a bias term, which equals to the sum of the logarithms of the variances and its a priori probability. Each centroid has been modeled as a Gaussian distribution whereby the centroid with the highest probability is found. Thus, when the centroids are recomputed with Equation 5, not only is a new centroid which is equivalent to the average of the feature vectors associated with the centroid found, but the variance in each dimension relating to that centroid is also found. Thus, a prototype for a particular class of sound is found.

With the different classes of sound established, there is still a need to associate each class with a particular identifier, i.e. a label for identifying the feature vector that has the closest match to it. This is done by a labeling procedure.

Figure 9:
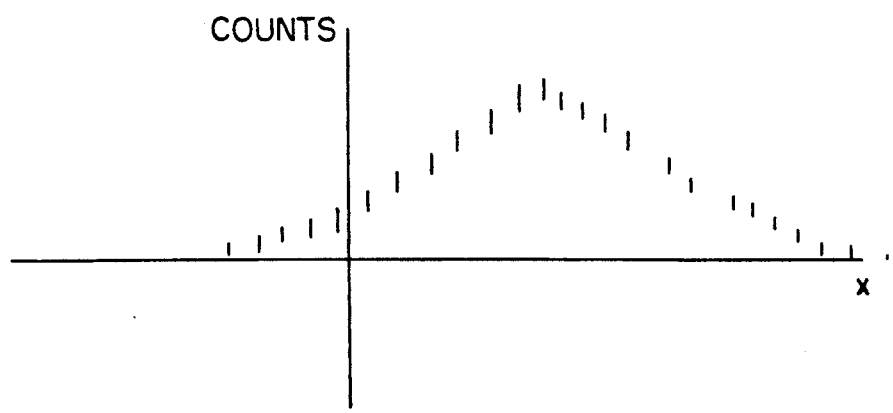
FIG. 9 is an illustration of an example distribution function of a given speech sound.

Before discussing the labeling procedure in depth, attention is directed to the histogram shown in FIG. 9 which is equivalent to a 1-dimensional "Gaussian distribution". In essence, each of the lines, i.e. counts, forming the histogram is a number of variables for demonstrating that the histogram distribution function has some average at its proximate center and trails at either end from the center of the distribution. A common way of modeling a distribution such as that shown in FIG. 9 is by the classical Gaussian distribution formula as shown below in Equation 6.

$$P(x) = \frac{1}{\sqrt{2\pi\sigma}} e^{-(x-m)/\sigma^2} \quad \text{(Eqn. 6)}$$

where P(x) is the probability of x.

Equation 6 allows computation of the probability of any particular point in x. If Equation 6 is integrated from infinity to minus infinity, it will yield 1. A Gaussian distribution that has a dimension greater than 1 is represented by the following Equation 7.

$$P(x) = \frac{1}{(2\pi)^{n/2}\pi_i\sigma_i} e^{-\tfrac{1}{2}[\Sigma_i(x_i - m_i)^2/\sigma_i^2]} \quad \text{(Eqn. 7)}$$

where $\overline{x}$ is vector x; and
$\pi_i$ with $\sigma_i$ is the product over the ith component of the square root of the variances of each dimension.

Equation 7 may be further condensed into Equation 8.

$$P(x) = N(m, \sigma) \quad \text{(Eqn. 8)}$$

where m is the mean in the ith dimension; and
$\sigma$ is the variance in the ith dimension.

The Gaussian distribution in the n-dimension has the probability that if it were integrated over all n-dimensions, the integral will be 1. Thus, when a sound, for example s, is represented as consisting of at least one centroid, it is analogous to modeling the region of the centroid as having an underlying Gaussian distribution whose mean is the centroid and whose variance is the same in all directions. Thus, the variance for a centroid is a circle. And the region, with m equalling 1, means the region has a mean value of 1. With this data, a probabilistic interpretation can be attached to the prototype vector by the use of the Gaussian distribution technique. It should be noted that although the Gaussian distribution technique is used for the discussion of the present invention embodiment, it is but one of the many available techniques that may be used.

From a probabilistic point of view, the goal is to find the class of sound $\hat{c}$ with the highest a posteriori probability given an input speech vector x. Such can be represented by the following equation:

$$\begin{aligned}\hat{c} &= \mathrm{argmax}_c P(c|x) \\ &= \mathrm{argmax}_c P(x|c) \cdot P(c)\end{aligned} \quad \text{(Eqn. 9)}$$

where c is equated with the classes of sound; and
P(c) is the a priori probability.

It should be noted that the a priori probability P(c) may be estimated by computing the relative class frequencies from the training data. For instance, the number of times in the training data each class of sound occurs is counted and normalized, i.e. add up the counts and divide by the total number of counts to get a number between 0 and 1 for that class of sound.

For an individual sound, such as the sound s, the following equation is therefore realized:

$$P(x|s) = \Sigma P_{cs} N(M_{cs}, \sigma_{cs})|_x \quad \text{(Eqn. 10)}$$

where $P(\overline{x}|s)$ is the probability of the input speech vector $\overline{x}$ being associated with the s sound;
$P_{Cs}$ is the a priori probability of the prototype given the class, as for example class s for Equation 10;
$P_{Cs}$ is the sum over all centroids;
N is the normal distribution;
$M_{Cs}$ is the vector of the means; and
$\sigma_{Cs}$ is the vector of the variances.

From Equation 10, the probability that a feature vector is produced by the sound s is given by the sum over all centroids with means $M_{Cs}$ given variances $\sigma_{Cs}$. In the case of the Euclidean distribution where the Euclidean distance is 1, the variance of the centroid $\sigma_C$ is 1. Thus, if there are two classes of sounds, for example the f and s sounds, and if a discrimination is being made between s and f, the probability that the input speech feature vector x is produced by sound s is represented by Equation 10. Similarly, the probability of speech vector $\overline{x}$ being represented by sound f is represented by Equation 10.

$$P(x|f) = \Sigma P_{cf} N(M_{cf}, \sigma_{cf})|_x \quad \text{(Eqn. 11)}$$

Thus, assuming that there are only f and s sounds, if there is an input feature vector $\overline{x}$, the probability that the feature vector is produced by either s or f can be computed by using equations 9, 10 and 11. Putting it differently, the input feature vector is associated with the sound class represented by either equation 10 or 11, depending on which equation has the higher probability of producing $\bar{x}$.

Even though each class of sound is being represented by approximately 50 centroids, it was found that there is nonetheless insufficient distinction between the labels identifying the sounds. This was found to be due to the fact that different sounds have different colorations associated with them, as for example the different varieties of s and f etc. Thus, if the system of the present invention is to have only 80 classes of sounds, i.e. 80 prototypes, a bad approximation of an input feature vector would result.

To remedy this, the first time that the centroid computation takes place, the inventors have arbitrarily chosen to divide each class of sound containing the 50 centroids into 4 groups of superclusters (subclasses, partitions or components) of approximately 12 centroids each. Thus, instead having only 80 prototypes in prototype store 10 (FIG. 1), with the division of each class of sound into 4 subclasses, partitions or components, there are now approximately 320 prototype vectors stored in prototype store 10. What comes out of vector quantizer 8 is therefore 4 different varieties of sounds for each class of sound, as for example different varieties of the s sound. Of course, it should be appreciated that the division of each of the 80 classes (or fundamental set of prototype vectors) into 4 additional subclasses is only chosen arbitrarily and can be changed for different systems. In fact, if more subclasses are used, a better output is provided. However, the number of subclasses has to be balanced with the operation of the system since, as the number of prototype vectors in the system increases, a corresponding greater amount of processing is required.

So far, the present invention comprises the following steps. First, training prototype vectors are stored in, for example training prototype vector store 68 shown in FIG. 11. These training prototype vectors are used to label the training utterances; and the labels that are produced by the training utterances are correlated with the speech sounds by the Viterbi alignment technique. And each set of acoustic feature vectors that corresponds to a speech sound is used to generate a set of centroids using the Euclidean clustering technique. Next, a new set of centroids is produced using the Gaussian clustering technique, to produce not only the centroids but also a set of variances and a priori probabilities associated with centroids. Thereafter, for each class, or fundamental set, of acoustic feature vectors corresponding to a speech sound, 4 different varieties (or subsets) of that sound each having roughly approximately 12 to 13 of the centroids are computed. And with the additional classes which include the different varieties of sound, a more reasonable number of labels is provided by the vector quantizer.

To further refine the system in order to decrease the error rate, all procedures, except for the additional preprocessing step, is repeated. For the repeated procedures, a new speech-sound-feature-vector correspondence procedure is performed. But instead of performing the same kind of correlation as discussed with reference to FIG. 4, for the second speech-sound-feature-vector correspondence procedure, each speech sound is now deemed to have three additional components, i.e. a beginning, a middle and an end. For example, an "ae" sound in the word "cat" actually has a beginning "ae", a middle "ae" and an end "ae". Likewise, the "dh" sound of the word "the" also has a beginning, a middle and an end sound.

Thus, instead of having 80 different classes for which Euclidean clustering are required, for the second speech sound feature vector procedure, Euclidean clustering is performed on approximately 230 to 250 classes so that the inventory of speech sounds is increased. This provides for a finer type, i.e. level, of speech sound which consists not only the speech sound, but also the beginning, the middle or the end of the speech sound, in relation to an input feature vector.

Further, for the second centroid computation for each of the new classes of sound, since there are now approximately 230 to 250 different classes of sound, there no longer is a need to further divide each of the classes into superclusters, particularly when each of the sound is already considered to be a variation of a base sound (or a fundamental set of sound). Furthermore, instead of using k-Means clustering to reduce 100 centroids to 50 centroids for each prototype vector, for the repeated centroid computation, each prototype vector is now clustered from 50 centroids to approximately 20. This reduced number of centroids results from the fact that there is now a larger number of sound classes and therefore there no longer is a need to represent each sound with 50 centroids. In other words, it is deemed to be sufficient to represent each of the beginning, middle or end portion of a sound with 20 centroids.

After the completion of the process of determining the centroids to the variances corresponding to all speech sounds, the initial prototype vectors are discarded and new prototype vectors are stored in the prototype vector store.

With the foregoing overall technique, the present invention provides for a system that may be referred to as being speaker independent. To elaborate, after the overall technique is performed, an output from vector quantizer 8 is a label that indicates the speech sound, and whether it is the beginning, the middle or the end portion of the sound. Therefore, if a label of "beginning s" is output from the vector quantizer, this label can clearly be interpreted as the beginning of a s sound. Thus, such label is speaker independent since it relates only the beginning of the s sound irrespective of which speaker is making such sound. In other words, even though different speakers may speak differently, the fact that the particular label is output from the vector quantizer means that this label is equally applicable to speech produced by different speakers. And since one person's labels essentially correspond to another person's labels, the probabilities associated with each label would be the same. Accordingly, it may not take as much time to re-estimate the labels for later persons as it was for the first person, as the probability of the same sound being generated is now known.

Figure 10:
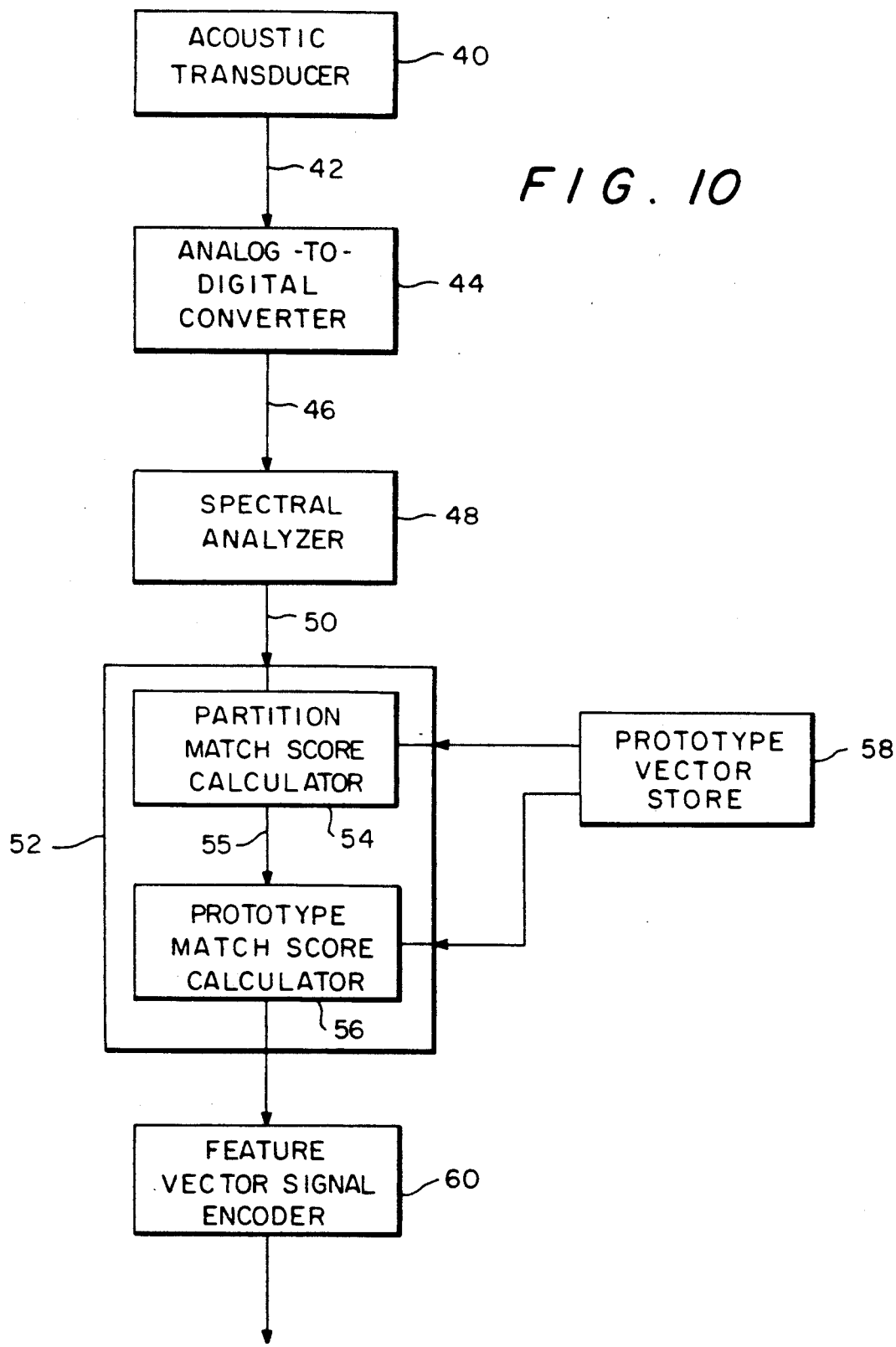
FIG. 10 is a simplified overall block diagram of different example components required to perform the technique of the present invention.

An embodiment of the hardware components required to accomplish the technique of the present invention is given in FIG. 10. As shown, a hardware embodiment of the present invention comprises an acoustic transducer 40 for accepting a speech signal such as 2 shown in FIG. 1. The analog signal representative of the speech signal is fed from acoustic transducer 40 via line 42 to an analog-to-digital converter 44. The analog signal is converted into a digital signal and is fed via line 46 to a spectral analyzer 48. The spectral analyzer may be equated with a portion of the signal processor 4 shown in FIG. 1 and is used to analyze the spectra and generate the feature vectors output at line 50. The feature vectors are provided to a processor 52 which comprises a partition match score calculator 54 and prototype match score calculator 56. Partition match score calculator 54 accepts as an additional input an output from a prototype store 58. Prototype match score signals output from prototype match score calculator 56 is fed to a feature vector signal encoder 60 whose function is to identify the feature vector that corresponds to the prototype vector having the best prototype match score. The identified feature vector is then labeled with an identifier, i.e. a label, associated with a class of sound.

For the discussion of the FIG. 10 overall block diagram, it is assumed that the prototype is equivalent to a class of sound. And each class of sound has a number of subclasses, as for example, the beginning, the middle or the end of the sound. These subclasses may also be referred to as partitions.

Returning to FIG. 10, as shown, the feature vectors provided by spectral analyzer 48 to processor 54 is first sent to partition match score calculator 54. There calculator 54 compares each of the feature vectors with the prototype vectors stored in prototype vector store 58 to arrive at a match score which represents a value of a match between the partitions and at least on of the feature values of the feature vector signal. The sum of the partition match scores may be fed from partition match score calculator 54 via line 55 to prototype match score calculator 56. Match score calculator 56 then calculates a prototype match score for each class. And since the sum of the partition match scores from the partitions are being fed to the prototype match score calculator 56, each prototype match score is representative of a function of the partition match scores for all partitions in the prototype or class. The prototype vector that has the best prototype match score after it is matched to the acoustic feature vector that comes closest to the sum of the partition score values would be designated as the prototype or class to which the feature vector is associated with. Accordingly, the identifier associated with that prototype (or class of sound) is used by feature vector signal encoder 60 to code that feature vector, to thereby output a label associated with that class of sound.

For the above discussion with respect to the FIG. 10 overall block diagram, it should be noted that the partition match score may be calculated by finding where on the Gaussian distribution the acoustic feature vector lies, per the FIG. 9 histogram.

Figure 11:
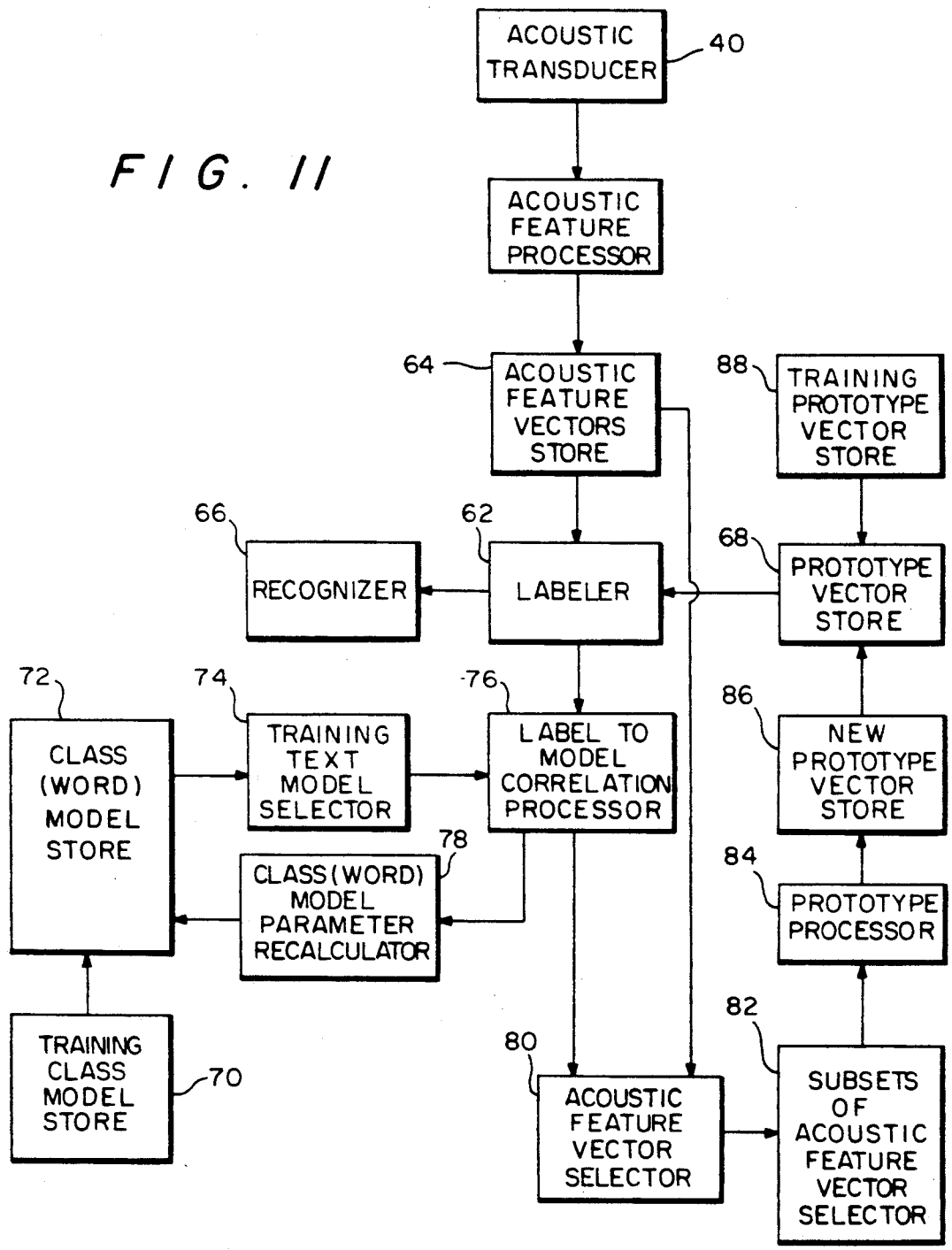
FIG. 11 is a block diagram illustrating one embodiment of the apparatus of the present invention.

A block diagram of an apparatus for performing the different steps discussed with respect to FIGS. 4, 6, 7 and 8 is given in FIG. 11. All of the steps of the present invention center around labeler 62, which takes as input a feature vector from acoustic feature vector store 64. Labels output from labeler 62 are fed to a recognizer 66 where further processing of the overall speech recognition system, of which the speech recognition features of the Acoustic Model discussed in this application is but one component, for further processing. To be able to perform labeling, labeler 62 also takes a set of prototypes from acoustic prototype vector store 68 in which prototype vectors representing the different classes of speech sound are stored.

To determine the prototype vectors (or prototype vector signals which may be equated with a network of elemental models) to be stored in prototype vector store 68, there first needs to be a speech-sound-feature-vector correspondence procedure which involves the path of the block diagram represented by training class model store 70, class model store 72, training text model selector 74, label to model correlator processor 76 and class model parameter recalculator 78. As was discussed before, a set of training classes (or training text or training elemental model) is provided in training class model store 70. This may be an inventory of 80 class sounds. Once the labels have been correlated with the models, as for example by using the method described in the speech-sound-feature-vector correspondence procedure described above, the speech vectors are then associated with the individual models of the sounds. Once all the feature vectors corresponding to a speech sound has been pooled and clustered by the Euclidean clustering technique described earlier, a new set of prototype vectors which include respective means, variances and a priori probabilities is fed by label to model correlator processor 76 to acoustic feature vector selector 80.

The set of acoustic feature vectors corresponding to a single speech sound is considered as a fundamental set of feature vector signals. The fundamental set of acoustic feature vectors can be divided into subsets or subclasses as for example the beginning, the middle and the end portions of the sound in subsets of acoustic feature vector selector 82. From there the subclasses of the prototype vectors, which now are the new prototype vectors, are processed by prototype processor 84 and stored in the new prototype vector store 86. Thus, labeler 62 compares the incoming feature vectors with the different prototype vectors stored in prototype vector store 68. And the centroid computation for the prototype vectors takes place in subsets of acoustic feature vector selector 82, prototype processor 84 and new prototype vector store 86.

Briefly, as discussed above, the path comprising class model store 72, training text model selector 74, label to model correlator processor 76 and class model parameter recalculator 78 encompasses the training of the speech sound models required by the system. This training requires a set of word models, obtained from training class model store 70 and class model store 72. It also requires a set of labels which is obtained from the correlation performed by the label to model correlator processor 76. These labels are used by class model parameter recalculator 78, using the Viterbi alignment procedure, to generate new word models and to align the feature vectors with the speech sounds. Once a new set of labels is obtained, the system has to be retrained with the new labels before a new speech-sound-feature-vector correspondence procedure is effected.

FIG. 12 is a simplified flow chart diagram illustrating how centroids are computed. Basically, feature vectors are obtained in block 90. Then a speech-sound-feature-vector correspondence procedure is performed in block 92. Thereafter, the fundamental class is divided into at least two subsets by the above described Euclidean technique in block 94. In block 96, the prototype vectors are calculated for each of the subsets so as to obtain the respective means, variances and a priori probabilities for each of the subsets.

FIG. 13 is a simplified flow chart diagram illustrating the additional preprocessing procedure discussed earlier. As shown, acoustic features are measured in block 98. Thereafter, a speech-sound-feature-vector correspondence procedure is effected in block 100. By a Generalized Eigenvectors technique, m-dimensional feature vectors are reoriented into n-dimensional feature vectors to get the best discrimination between the different classes. After that, the feature vectors are projected into a n-dimensional space in block 104.

FIG. 14 illustrates in simplified flow chart diagram format the speech-sound-feature-vector correspondence procedure described earlier. Essentially, a set of acoustic feature vectors are taken from block 106 and provided as input to produce a set of labels in block 108. The labels are then provided to block 110 in which Viterbi alignment is performed to correlate the model of an utterance with the different acoustic feature vectors. The output from block 110 at 112 is provided to blocks 92 and 100 of FIGS. 12 and 13, respectively. Block 114 and 116 provide the training text of the sentences for which the Viterbi alignment requires.

Inasmuch as the present invention is subject to many variations, modifications and changes in detail, it is intended that all matter described throughout this specification and shown in the accompanying drawings be interpreted as illustrative only and not in a limiting sense. Accordingly, it is intended that the invention be limited only the spirit and scope of the appended claims.

We claim:

1. A speech coding apparatus comprising:
   means for storing a plurality of classes each having an identifier represented by at least two of a plurality of prototypes, each of the plurality of prototypes having at least one prototype value;
   transducer means for extracting from an utterance a feature vector signal having at least one feature value;
   means for establishing a match between the feature vector signal and at least one of the classes by selecting from the plurality of prototypes at least one prototype having a prototype value that best matches the feature value of the feature vector signal; and
   means for coding the feature vector signal with the identifier of the class represented by the selected at least one prototype vector.

2. Speech coding apparatus of claim 1, wherein the prototype value of the at least one prototype is computed from at least means, variances and a priori probabilities of a set of acoustic feature vectors associated with the prototype.

3. Speech coding apparatus of claim 1, wherein the prototype value of the at least one prototype is computed by associating location of the feature value of the one feature vector signal on a probability distribution function of the prototype.

4. Speech coding apparatus of claim 1, wherein each class of the plurality of classes is represented by a plurality of prototypes whose respective prototype values are considered as a whole against the feature value of the feature vector signal to determine whether the feature vector signal corresponds to the class.

5. Speech coding apparatus of claim 1, further comprising:
   means for storing a plurality of training classes;
   means for measuring and transforming training utterances into a series of training feature vectors each having a feature value: and
   means for correlating each of the series of training feature vectors with one of the training classes to generate the plurality of stored classes.

6. Speech coding apparatus of claim 5, further comprising:
   means for measuring and extracting from utterances over successive predetermined time periods corresponding successive sets of feature vectors, each feature vector of the successive sets of feature vectors having a dimensionality of at least one feature value;
   means for merging the feature vectors in each of the successive sets of feature vectors to form a plurality of consolidated feature vectors whose respective dimensionalities being the sum of the dimensionalities of the corresponding merged feature vectors, the consolidated feature vectors being more adaptable for discrimination between the stored training classes; and
   means for spatially reorienting the consolidated feature vectors to reduce their dimensionality to thereby effect easier manipulation thereof.

7. Speech coding apparatus of claim 6, wherein each of the training classes is divided into training subclasses, further comprising:
   means for configuring the training subclasses as respective training distribution functions having corresponding means, variances and a priori probabilities; and
   means for storing the training distribution functions, each of the training distribution functions representing a training prototype.

8. Speech coding apparatus of claim 7, wherein each of the stored classes has at least one subcomponent; and
   wherein the correlating means correlates the series of feature vectors with the at least one subcomponent to generate a plurality of stored component classes.

9. Speech coding apparatus of claim 8, wherein the configuring means further configures the plurality of component classes as respective distribution functions each having corresponding means, variances and a priori probabilities; further comprising:
   means for storing the distribution functions representing the component classes, each of the distribution functions of the component classes representing a prototype.

10. Speech coding apparatus of claim 1, wherein the coding means comprises:
    a quantizing means for outputting a label corresponding to the coded feature vector signal.

11. Speech coding apparatus of claim 1, wherein the establishing means comprises:
    means for grouping a plurality of speech feature vectors into a predetermined number of prototypes each having respective means, variances and a priori probabilities; and
    means for dividing each of the predetermined number of prototypes into at least two sub-prototypes to better differentiate the feature vector signal from other feature vector signals.

12. A speech coding apparatus comprising:
    means for storing a plurality of prototypes representative of a plurality of classes, each class having an identifier represented by at least two of the plurality of prototypes, each of the plurality of prototypes having at least one prototype value;
    transducer means for extracting from an utterance a feature vector signal having at least one feature value;
    means for establishing a match between the feature vector signal and at least one class by comparing the feature value of the feature vector signal against the respective prototype values of the prototypes;

means for coding the feature vector signal with the identifier of the class represented by any of the prototypes having a prototype value most closely matching the feature value of the feature vector signal.

13. Speech coding apparatus of claim 12, wherein each class is represented by a number of prototypes of the plurality of prototypes, the respective prototype values of the prototypes of each class being considered as a whole against the feature value of the feature vector signal to determine which class of the plurality of classes the feature vector signal best corresponds to.

14. Speech coding apparatus of claim 12, wherein the prototype value of each prototype is computed from at least means, variances and a priori probabilities of a set of acoustic feature vectors associated with the prototype.

15. Speech coding apparatus of claim 12, wherein each prototype has a score value computed by associating location of the feature value of the one feature vector signal on a probability distribution function of the prototype.

16. Speech coding apparatus of claim 12, further comprising:
means for storing a plurality of training classes;
means for measuring and transforming training utterances into a series of training feature vectors each having a feature value: and
means for correlating each of the series of training feature vectors with one of the training classes to generate the plurality of stored classes.

17. Speech coding apparatus of claim 16, further comprising:
means for measuring and extracting from utterances over successive predetermined time periods corresponding successive sets of feature vectors, each feature vector of the successive sets of feature vectors each having a dimensionality and at least one feature value;
means for merging the feature vectors in each of the successive sets of feature vectors to form a plurality of consolidated feature vectors whose respective dimensionalities being the sum of the dimensionalities of the corresponding merged feature vectors, the consolidated feature vectors being more adaptable for discrimination between the stored training classes; and
means for spatially reorienting the consolidated feature vectors to reduce their dimensionality to thereby afford easier manipulation thereof.

18. Speech coding apparatus of claim 17, wherein each of the training classes is divided into training subclasses, further comprising:
means for configuring the training subclasses as respective training distribution function having corresponding means, variances and a priori probabilities; and
means for storing the training distribution functions, each of the training distribution functions representing a training prototype.

19. Speech coding apparatus of claim 18, wherein each of the stored classes has at least one subcomponent; and
wherein the correlating means correlates the series of feature vectors with the at least one subcomponent to generate a plurality of stored component classes.

20. Speech coding apparatus of claim 19, wherein the configuring means further configures the plurality of component classes as respective distribution functions each having corresponding means, variances and a priori probabilities; further comprising:
means for storing the distribution functions representing the component classes, each of the distribution functions of the component classes representing a prototype.

21. Speech coding apparatus of claim 12, wherein the coding means comprises:
a quantizing means for outputting a label corresponding to the coded feature vector signal.

22. Speech coding apparatus of claim 12, wherein the establishing means comprises:
means for grouping a plurality of speech feature vectors into a predetermined number of prototype each having respective means, variances and a priori probabilities; and
means for dividing each of the predetermined number of prototype into at least two sub-prototypes to better differentiate the feature vector signal from other feature vector signals.

23. A method of coding speech comprising the steps of:
(a) storing in a memory means a plurality of classes each having an identifier represented by at least two of a plurality of prototypes, each of the plurality of prototypes having at least one prototype value;
(b) using transducer means to extract from an utterance a feature vector signal having at least one feature value;
(c) establishing a correspondence between the feature vector signal and at least one class of the plurality of classes by selecting from among a plurality of prototypes at least one prototype whose prototype value most closely matches the feature value of the feature vector signal; and
(d) coding the feature vector signal with the identifier of class represented by the selected at least one prototype.

24. The method of claim 23, wherein prior to step (a), the method further comprising the steps of:
establishing an inventory of training classes;
extracting training feature vectors from a string of training text; and
correlating each of the feature vectors with one of the training classes.

25. The method of claim 24, further comprising the steps of:
measuring and extracting from utterances over successive predetermined periods of time corresponding successive sets of feature vectors, each feature vector of the successive sets of feature vectors having a dimensionality of at least one feature value;
merging the feature vectors in each of the successive sets of feature vectors to form a plurality of consolidated feature vectors whose respective dimensionalities being the sum of the dimensionalities of the corresponding merged feature vectors, the consolidated feature vectors being more adaptable for discrimination between the stored training classes; and
spatially reorienting the consolidated feature vectors to reduce their dimensionalities to thereby effect easier manipulation thereof.

26. The method of claim 25, further comprising the steps of:

establishing the number of prototypes required to provide adequate representation of a class; and wherein for each of the training classes, the method further comprising the steps of:

selecting a number of training prototypes;

calculating respective new training prototypes by averaging the respective values of feature vectors situated proximate to each of the training prototypes until the average distance between the feature vectors remains substantially constant; and successively replacing the two closest new training prototypes with another new training prototype whose value is the average of the values of the replaced training prototypes until a predetermined number of another training prototypes remains.

27. The method of claim 26, further comprising the steps of:

using a distribution analysis on the predetermined number of training prototypes to calculate a corresponding set of new training prototypes each having an estimated means, variances and a priori probabilities; and dividing each new training prototype into corresponding additional training prototypes.

28. The method of claim 24, wherein the correlating step comprises utilizing a viterbi alignment technique.

29. The method of claim 23, wherein step (c) further comprises the steps of:

establishing the number of prototypes required to provide adequate representation for a class; and wherein for each of the classes, the method further comprising the steps of:

selecting a number of prototypes;

calculating respective new prototypes by averaging the respective values of feature vectors situated proximate to each of the prototypes until the average distance between the feature vectors remains substantially constant; and successively replacing the two closest new prototypes with another new prototype whose value is the average of the values of the replaced prototypes until a predetermined number of another prototypes remains.

30. The method of claim 29, further comprising the steps of:

using a distribution analysis on the predetermined number of the another prototypes to calculate a corresponding set of prototypes each having estimated means, variances and a priori probabilities;

dividing each prototype having the estimated means, variances and a priori probabilities into additional prototypes to provide a greater number of prototypes for comparison with the feature vector signal.

31. The method of claim 23, wherein the prototype value of the at least one prototype is computed from means, variances and a priori probabilities of a set of acoustic feature vectors associated with the prototype.

32. The method of claim 23, wherein the prototype value of the at least one prototype is computed by associating the location of the feature value of the one feature vector signal on a probability distribution function of the prototype.

33. A method of coding speech comprising the steps of:

(a) storing in a memory means a plurality of prototype vectors representative of a plurality of classes, each class having an identifier represented by at least one of the plurality of prototype vectors, each of the plurality of prototype vectors having at least one prototype value;

(b) using transducer means to extract from an utterance a feature vector signal having a feature value;

(c) establishing a correspondence between the feature vector signal and at least one class by comparing the feature value of the feature vector signal against the respective prototype values of the prototype vectors;

(d) coding the feature vector signal with the identifier of the class represented by any of the prototype vectors having a prototype value that most closely matches the feature value of the feature vector signal.

34. The method of claim 33, wherein each class is represented by a number of prototype vectors of the plurality of prototype vectors, and wherein the method further comprising the step of:

considering the respective prototype values of the prototype vectors of each class as a whole against the feature value of the feature vector signal to determine which class of the plurality of classes the feature vector signal best corresponds to.

35. The method of claim 33, wherein prior to step (a), the method further comprising the steps of:

establishing an inventory of training classes;

extracting training feature vectors from a string of training text; and correlating each of the feature vectors with one of the training classes.

36. The method of claim 35, further comprising the steps of:

measuring and extracting from utterances over successive predetermined periods of time corresponding successive sets of feature vectors, each feature vector of the successive sets of feature vectors having a dimensionality of at least one feature value;

merging the feature vectors in each of the successive sets of feature vectors to form a plurality of consolidated feature vectors whose respective dimensionalities being the sum of the dimensionalities of the corresponding merged feature vectors, the consolidated feature vectors being more adaptable for discrimination between the stored training classes; and spatially reorienting the consolidated feature vectors to reduce their dimensionalities to thereby effect easier manipulation thereof.

37. The method of claim 36, further comprising the steps of:

establishing the number of prototype vectors required to provide adequate representation of a class; and wherein for each of the training classes, the method further comprising the steps of:

selecting a number of training prototype vectors;

calculating respective new training prototype vectors by averaging the respective values of feature vectors situated proximate to each of the training prototype vectors until the average distance between the feature vectors remains substantially constant; and successively replacing the two closest new training prototype vectors with another new training prototype vector whose value is the average of the values of the replaced training prototype vectors until a predetermined number of another training prototype vectors remains.

38. The method of claim 37, further comprising the steps of:
   using a distribution analysis on the predetermined number of training prototype vectors to calculate a corresponding set of new training prototype vectors each having estimated means, variances and a priori probabilities; and
   dividing each new training prototype vector into corresponding additional training prototype vectors.

39. The method of claim 33, wherein step (c) further comprises the steps of:
   establishing the number of prototype vectors required to provide adequate representation for a class; and wherein for each of the classes, the method further comprising the steps of:
   selecting a number of prototype vectors;
   calculating respective new prototype vectors by averaging the respective values of feature vectors situated proximate to each of the prototype vectors until the average distance between the feature vectors remains substantially constant; and
   successively replacing the two closest new prototype vectors with another new prototype vector whose value is the average of the values of the replaced prototype vectors until a predetermined number of another prototype vectors remains.

40. The method of claim 39, further comprising the steps of:
   using a distribution analysis on the predetermined number of the another prototype vectors to calculate a corresponding set of prototype vectors each having estimated means, variances and a priori probabilities;
   dividing each prototype vector having the estimated means, variances and a priori probabilities into additional prototype vectors to provide a greater number of prototype vectors for comparison with the feature vector signal.

41. The method of claim 33, wherein the correlating step comprises utilizing a Viterbi alignment technique.

42. The method of claim 33, wherein the prototype value of the at least one prototype vector is computed from means, variances and a priori probabilities of a set of acoustic feature vectors associated with the prototype.

43. The method of claim 33, wherein the prototype value of the at least one prototype vector is computed by associating location of the feature value of the one feature vector signal on a probability distribution function of the prototype vector.

44. A speech coding apparatus comprising:
   means for storing two or more prototype vector signals, each prototype vector signal representing a prototype vector having an identifier and at least two partitions, each partition having at least one partition value;
   transducer means for measuring value of at least one feature of an utterance during a time interval to produce a feature vector signal representing the value of the at least one feature of the utterance;
   means for calculating a match score for each partition, each partition match score representing the value of a match between the partition value of the partition and the feature value of the feature vector signal;
   means for calculating a prototype match score for each prototype vector, each prototype match score representing a function of the partition match scores for all partitions in the prototype vector; and
   means for coding the feature vector signal with the identifier of the prototype vector signal having a best prototype match score.

45. An apparatus as claimed in claim 44, characterized in that:
   each partition match score is proportional to the joint probability of occurrence of the feature value of the feature vector signal and the partition value of the partition; and
   the prototype match score represents the sum of the partition match scores for all partitions in the prototype vector.

46. An apparatus as claimed in claim 45, further comprising means for generating prototype vector signals, said prototype vector signal generating means comprising:
   means for measuring the value of at least one feature of a training utterance during each of a series of successive first time intervals to produce a series of training corresponding to a first time interval, each training feature vector signal representing the value of at least one feature of the training utterance during a second time interval containing the corresponding first time interval, each second time interval being greater than or equal to the corresponding first time interval;
   means for providing a network of elemental models corresponding to the training utterance;
   means for correlating the training feature vector signals in the series of training feature vector signals to the elemental models in the network of elemental models corresponding to the training utterance so that each training feature vector signal in the series of training feature vector signals corresponds to one elemental model in the network of elemental models corresponding to the training utterance;
   means for selecting a fundamental set of all training feature vector signals which correspond to all occurrences of a first elemental model in the network of elemental models corresponding to the training utterance;
   means for selecting at least first and second different subsets of the fundamental set of training feature vector signals to form a first label set of training feature vector signals;
   means for calculating centroid of the feature values of the training feature vector signals of each of the first and second subsets of the fundamental set; and
   means for storing a first prototype vector signal corresponding to the first label set of training feature vector signals, said first prototype vector signal representing a first prototype vector having at least first and second partitions, each partition having at least one partition value, the first partition having a partition value equal to the value of the centroid of the feature values of the training feature vector signals in the first subset of the fundamental set, the second partition having a partition value equal to the value of the centroid of the feature values of the training feature vector signals in the second subset of the fundamental set.

47. An apparatus as claimed in claim 46, characterized in that the centroid is arithmetic average.

48. An apparatus as claimed in claim 47, characterized in that the network of elemental models is a series of elemental models.

49. An apparatus as claimed in claim 48, characterized in that:
the fundamental set of training feature vector signals is divided into at least first, second and third subsets of training feature vector signals;
the calculating means further calculates the centroid of the feature values of the training feature vector signals in the third subset; and
the apparatus further comprises means for storing a second prototype vector signal, said second prototype vector signal representing the value of the centroid of the feature values of the training feature vector signals in the third subset of the fundamental set.

50. An apparatus as claimed in claim 49, characterized in that:
the feature values of the training feature vector signals in each subset of the fundamental set have a feature value variance and a a priori probability;
the apparatus further comprises means for calculating the variance and a priori probability of the feature values of the training feature vector signals in each subset of the fundamental set;
the first partition of the first prototype vector has a further partition value equal to the value of the variance and a priori probability of the feature values of the training feature vector signals in the first subset of the fundamental set;
the second partition of the first prototype vector has a further partition value equal to the value of the variance and a priori probability of the feature values of the training feature vector signals in the second subset of the fundamental set; and
the second prototype signal represents the value of the variance and a priori probability of the feature values of the training feature vector signals in the third subset of the fundamental set.

51. An apparatus as claimed in claim 50, characterized in that:
the apparatus further comprises means for estimating conditional probability of occurrence of each subset of the fundamental set of training feature vector signals given the occurrence of the first label set;
the apparatus further comprises means for estimating the probability of occurrence of the first label set of training feature vector signals;
the first prototype vector further represents the estimated probability of occurrence of the first label set of training feature vector signals;
the first partition of the first prototype vector has a further partition value equal to the estimated conditional probability of occurrence of the first subset of the fundamental set of training feature vector signals given the occurrence of the first label set; and
the second partition of the first prototype vector has a further partition value equal to the estimated conditional probability of occurrence of the second subset of the fundamental set of training feature vector signals given the occurrence of the first label set.

52. An apparatus as claimed in claim 51, characterized in that:
each second time interval is equal to at least two first time intervals; and
each feature vector signal comprises at least two feature values of the utterance at two different times.

53. An apparatus as claimed in claim 52, characterized in that each feature vector signal represents values of m features, where m is an integer greater than or equal to two;
each partition has n partition values, where n is less than m; and
the apparatus further comprises means for transforming the m values of each feature vector signal to n values prior to calculating the centroids, and variances and a priori probability of the subsets.

54. An apparatus as claimed in claim 53, characterized in that:
the elemental models are elemental probabilistic models;
the correlating means comprises means for aligning the feature vector signals and the elemental probabilistic models.

55. A speech coding method comprising the steps of:
storing two or more prototype vector signals, each prototype vector signal representing a prototype vector having an identifier and at least two partitions, each partition having at least one partition value;
using transducer means to measure a value of at least one feature of an utterance during a time interval to produce a feature vector signal representing the value of the at least one feature of the utterance;
calculating a match score for each partition, each partition match score representing the value of a match between the partition value of the partition and the feature value of the feature vector signal;
calculating a prototype match score for each prototype vector, each prototype match score representing a function of the partition match scores for all partitions in the prototype vector; and
coding the feature vector signal with the identifier of the prototype vector signal having the a prototype match score.

56. A method as claimed in claim 55, characterized in that:
each partition match score is proportional to the joint probability of occurrence of the feature value of the feature vector signal and the partition value of the partition; and
the prototype match score represents the sum of the partition match scores for all partitions in the prototype vector.

57. A method as claimed in claim 56, further comprising a method of generating prototype vector signals, said prototype vector signal generating method comprising:
measuring the value of at least one feature of a training utterance during each of a series of successive first time intervals to produce a series of training feature vector signals, each training feature vector signal corresponding to a first time interval, each training feature vector signal representing the value of at least one feature of the training utterance during a second time interval containing the corresponding first time interval, each second time interval being greater than or equal to the corresponding first time interval;
providing a network of elemental models corresponding to the training utterance;

correlating the training feature vector signals in the series of training feature vector signals to the elemental models in the network of elemental models corresponding to the training utterance so that each training feature vector signal in the series of training feature vector signals corresponds to one elemental model in the network of elemental models corresponding to the training utterance;

selecting a fundamental set of all training feature vector signals which correspond to all occurrences of a first elemental model in the network of elemental models corresponding to the training utterance;

selecting at least first and second different subsets of the fundamental set of training feature vector signals to form a first label set of training feature vector signals;

calculating centroid of the feature values of the training feature vector signals of each of the first and second subsets of the fundamental set; and storing a first prototype vector signal corresponding to the first label set of training feature vector signals, said first prototype vector signal representing a first prototype vector having at least first and second partitions, each partition having at least one partition value, the first partition having a partition value equal to the value of the centroid of the feature values of the training feature vector signals in the first subset of the fundamental set, the second partition having a partition value equal to the value of the centroid of the feature values of the training feature vector signals in the second subset of the fundamental set.

58. A method as claimed in claim 57, characterized in that the centroid is arithmetic average.

59. A method as claimed in claim 58, characterized in that the network of elemental models is a series of elemental models.

60. A method as claimed in claim 59, characterized in that:
the fundamental set of training feature vector signals is divided into at least first, second and third subsets of training feature vector signals;
the calculating step further calculates the centroid of the feature values of the training feature vector signals in the third subset; and
the method further comprises the step of storing a second prototype vector signal, said second prototype vector signal representing the value of the centroid of the feature values of the training feature vector signals in the third subset of the fundamental set.

61. A method as claimed in claim 60, characterized in that:
the feature values of the training feature vector signals in each subset of the fundamental set have a feature value variance and a priori probability;
the method further comprises the step of calculating the variance and a priori probability of the feature values of the training feature vector signals in each subset of the fundamental set;
the first prototype signal represents the values of the variance and a priori probability of the feature values of the training feature vector signals in the first and second subsets of the fundamental set; and
the second prototype signal represents the value of the variance and a priori probability of the feature values of the training feature vector signals in the third subset of the fundamental set.

62. A method as claimed in claim 61, characterized in that:
the method further comprises the step of estimating conditional probability of occurrence of each subset of the fundamental set of training feature vector signals given the occurrence of the first label set;
the method further comprises the step of estimating the probability of occurrence of the first label set of training feature vector signals;
the first prototype vector further represents the estimated probability of occurrence of the first label set of training feature vector signals;
the first partition of the first prototype vector has a further partition value equal to the estimated conditional probability of occurrence of the first subset of the fundamental set of training feature vector signals given the occurrence of the first label set; and
the second partition of the first prototype vector has a further partition value equal to the estimated conditional probability of occurrence of the second subset of the fundamental set of training feature vector signals given the occurrence of the first label set.

63. A method as claimed in claim 62, characterized in that:
each second time interval is equal to at least two first time intervals; and
each feature vector signal comprises at least two feature values of the utterance at two different times.

64. A method as claimed in claim 63, characterized in that:
each feature vector signal represents values of m features, where m is an integer greater than or equal to two;
each partition has n partition values, where n is less than m; and
the method further comprises the step of transforming the m values of each feature vector signal to n values prior to calculating the centroids and variance and a priori probability of the subsets.

65. A method as claimed in claim 64, characterized in that:
the elemental models are elemental probabilistic models;
the correlating step comprises the step of aligning the feature vector signals and the elemental probabilistic models.

66. An article for configuring a machine to perform a method of speech coding comprising the steps of:
storing two or more prototype vector signals, each prototype vector signal representing a prototype vector having an identifier and at least two partitions, each partition having at least one partition value;
using transducer means to measure a value of at least one feature of an utterance during a time interval to produce a feature vector signal representing the value of the at least one feature of the utterance;
calculating a match score for each partition, each partition match score representing the value of a match between the partition value of the partition and the feature value of the feature vector signal;
calculating a prototype match score for each prototype vector, each prototype match score representing a function of the partition match scores for all partitions in the prototype vector; and coding the feature vector signal with the identifier of the prototype vector signal having a best prototype match score.

67. An article as claimed in claim 66, characterized in that:

each partition match score is proportional to the joint probability of occurrence of the feature value of the feature vector signal and the partition value of the partition; and the prototype match score represents the sum of the partition match score for all partitions in the prototype vector.

68. An article as claimed in claim 67, further comprising a method of generating prototype vector signal, said prototype vector signal generating method comprising:

measuring the value of at least one feature of a training utterance during each of a series of successive first time intervals to produce a series of training feature vector signals, each training feature vector signal corresponding to a first time interval, each training feature vector signal representing the value of at least one feature of the training utterance during a second time interval containing the corresponding first time interval, each second time interval being greater than or equal to the corresponding first time interval;

providing a network of elemental models corresponding to the training utterance;

correlating the training feature vector signals in the series of training feature vector signals to the elemental models in the network of elemental models corresponding to the training utterance so that each training feature vector signal in the series of training feature vector signals corresponds to one elemental model in the network of elemental models corresponding to the training utterance;

selecting a fundamental set of all training feature vector signals which corresponds to all occurrences of a first elemental model in the network of elemental models corresponding to the training utterance;

selecting at least first and second different subsets of the fundamental set of training feature vector signals to form a first label set of training feature vector signals;

calculating centroid of the feature values of the training feature vector signals of each of the first and second subsets of the fundamental set; and storing a first prototype vector signal corresponding to the first label set of training feature vector signals, said first prototype vector signal representing a first prototype vector having at least first and second partitions, each partition having at least one partition value, the first partition having a partition value equal to the value of the centroid of the feature values of the training feature vector signals in the first subset of the fundamental set, the second partition having a partition value equal to the value of the centroid of the feature values of the training feature vector signals in the second subset of the fundamental set.

69. An article as claimed in claim 68, characterized in that the centroid is arithmetic average.

70. An article as claimed in claim 69, characterized in that the network of elemental models is a series of elemental models.

71. An article as claimed in claim 70, characterized in that:

the fundamental set of training feature vector signals is divided into at least first, second and third subsets of training feature vector signals;

the calculating step further calculates the centroid of the feature values of the training feature vector signals in the third subset; and the method further comprises the step of storing a second prototype vector signal, said second prototype vector signal representing the value of the centroid of the feature values of the training feature vector signals in the third subset of the fundamental set.

72. An article as claimed in claim 71, characterized in that:

the feature values of the training feature vector signals in each subset of the fundamental set have a feature value variance and a priori probability;

the method further comprises the step of calculating the variance and a priori probability of the feature values of the training feature vector signals in each subset of the fundamental set;

the first prototype signal represents the values of the variance and a priori probability of the feature values of the training feature vector signals in the first and second subsets of the fundamental set; and the second prototype signal represents the value of the variance and a priori probability of the feature values of the training feature vector signals in the third subset of the fundamental set.

73. An article as claimed in claim 72, characterized in that:

the method further comprises the step of estimating conditional probability of occurrence of each subset of the fundamental set of training feature vector signals given the occurrence of the first label set;

the method further comprises the step of estimating the probability of occurrence of the first label set of training feature vector signals;

the first prototype vector further represents the estimated probability of occurrence of the first label set of training feature vector signals;

the first partition of the first prototype vector has a further partition value equal to the estimated conditional probability of occurrence of the first subset of the fundamental set of training feature vector signals given the occurrence of the first label set; and the second partition of the first prototype vector has a further partition value equal to the estimated conditional probability of occurrence of the second subset of the fundamental set of training feature vector signals given the occurrence of the first label set.

74. An article as claimed in claim 73, characterized in that:

each second time interval is equal to at least two first time intervals; and each feature vector signal comprises at least two feature values of the utterance at two different times.

75. An article as claimed in claim 74, characterized in that:

each feature vector signal represents values of m features, where m is an integer greater than or equal to two;

each partition has n partition values, where n is less than m; and the method further comprises the step of transforming the m values of each feature vector signal to n values prior to calculating the centroids and variance and a priori probability of the subsets.

76. An article as claimed in claim 75, characterized in that:

the elemental models are elemental probabilistic models;

the correlating step comprises the step of aligning the feature vector signals and the elemental probabilistic models.

* * * * *